US012568742B2

(12) United States Patent
Son et al.

(10) Patent No.: US 12,568,742 B2
(45) Date of Patent: Mar. 3, 2026

(54) DISPLAY PANEL AND ELECTRONIC DEVICE INCLUDING SAME

(71) Applicant: Samsung Display Co., Ltd., Yongin-si (KR)

(72) Inventors: Sungmin Son, Yongin-si (KR); Jaejin Song, Yongin-si (KR); Kwangsae Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 285 days.

(21) Appl. No.: 18/447,047

(22) Filed: Aug. 9, 2023

(65) Prior Publication Data

US 2024/0065059 A1    Feb. 22, 2024

(30) Foreign Application Priority Data

Aug. 17, 2022    (KR) ......................... 10-2022-0102506

(51) Int. Cl.
H10K 59/131 (2023.01)

(52) U.S. Cl.
CPC .................................. H10K 59/131 (2023.02)

(58) Field of Classification Search
CPC .................................................... H10K 59/131
See application file for complete search history.

(56) References Cited

U.S. PATENT DOCUMENTS 9,696,835 B2    7/2017  Her
2020/0258967 A1    8/2020  Kim et al.

2021/0343222 A1*   11/2021  Hei ...................... G09G 3/3233
2022/0102421 A1*    3/2022  Yang .................... H10H 20/857
2022/0246687 A1     8/2022  Lee et al.

FOREIGN PATENT DOCUMENTS

| CN | 111009195 A | 4/2020 |
|---|---|---|
| CN | 112038373 A | 12/2020 |
| CN | 113178163 A | 7/2021 |
| CN | 113178537 A | 7/2021 |
| KR | 10-2096622 B1 | 4/2020 |
| KR | 10-2020-0097371 A | 8/2020 |
| KR | 10-2022-0110396 A | 8/2022 |

* cited by examiner

*Primary Examiner* — Douglas M Menz
(74) *Attorney, Agent, or Firm* — Womble Bond Dickinson (US) LLP

(57) ABSTRACT

A display panel includes first light-emitting diodes in a first display area, second light-emitting diodes in a second display area inside the first display area and including a transmission area, third light-emitting diodes in a third display area between the first and second display areas, sub-pixel circuits in the third display area, and a transparent conductive bus line electrically connected to one sub-pixel circuit and extending from the third display area towards the second display area, wherein first electrodes of k (k is a even number) second light-emitting diodes emitting light of a first color are electrically connected to each other, and the transparent conductive bus line is connected to a connection line connecting a first electrode of a $(k/2)^{th}$ second light-emitting diode and a first electrode of a $(k/2+1)^{th}$ second light-emitting diode to each other from among the k second light-emitting diodes.

20 Claims, 16 Drawing Sheets

DISPLAY PANEL AND ELECTRONIC DEVICE INCLUDING SAME

CROSS-REFERENCE TO RELATED APPLICATION

The present application claims priority to and the benefit of Korean Patent Application No. 10-2022-0102506, filed on Aug. 17, 2022, in the Korean Intellectual Property Office, the entire disclosure of which is incorporated herein by reference.

BACKGROUND

1. Field

Aspects of one or more embodiments relate to a display panel and a structure of an electronic device including the same.

2. Description of the Related Art

Display panels are apparatuses that visually display data. Recently, the uses and applications of display panels has become diversified. The thicknesses and weights of display panels are decreasing, and thus the range of uses of display panels is widening.

To increase the area occupied by a display area while adding various functions, continuous research into a display panel for adding functions other than image display inside the display area is being conducted.

The above information disclosed in this Background section is only for enhancement of understanding of the background and therefore the information discussed in this Background section does not necessarily constitute prior art.

SUMMARY

One or more embodiments include a display panel including a transmission area in a display area, and a structure of an electronic device including the display panel.

Additional aspects will be set forth in part in the description which follows and, in part, will be apparent from the description, or may be learned by practice of the presented embodiments of the disclosure.

According to one or more embodiments, a display panel includes a plurality of first light-emitting diodes arranged in a first display area, a plurality of second light-emitting diodes arranged in a second display area located inside the first display area and including a transmission area, a plurality of third light-emitting diodes arranged in a third display area between the first display area and the second display area, a plurality of sub-pixel circuits arranged in the third display area and electrically connected to the plurality of second light-emitting diodes and the plurality of third light-emitting diodes, and a transparent conductive bus line electrically connected to one sub-pixel circuit from among the plurality of sub-pixel circuits and extending from the third display area towards the second display area, wherein first electrodes of k second light-emitting diodes emitting light of a first color from among the plurality of second light-emitting diodes are electrically connected to each other, wherein k is an even number, and the transparent conductive bus line is connected to a connection line, wherein the connection line connects a first electrode of a $(k/2)^{th}$ second light-emitting diode of the first color and a first electrode of a $(k/2+1)^{th}$ second light-emitting diode of the first color to each other from among the k second light-emitting diodes emitting the light of the first color.

According to some embodiments, each of the first electrodes of the k second light-emitting diodes emitting the light of the first color may include a plurality of sub-layers.

According to some embodiments, the connection line may be integrally coupled to one sub-layer from among the plurality of sub-layers of the second light-emitting diode connected to the connection line.

According to some embodiments, the connection line may include a crystalized indium tin oxide.

According to some embodiments, the display panel may further include at least one insulating layer located between the transparent conductive bus line and each of first electrodes of the plurality of second light-emitting diodes, and between the transparent conductive bus line and the connection line, wherein the connection line may be electrically connected to the transparent conductive bus line through a contact hole of the at least one insulating layer.

According to one or more embodiments, a display panel includes a plurality of first light-emitting diodes arranged in a first display area, a plurality of second light-emitting diodes arranged in a second display area located inside the first display area and including a transmission area, a plurality of third light-emitting diodes arranged in a third display area between the first display area and the second display area, a plurality of sub-pixel circuits arranged in the third display area and electrically connected to the plurality of second light-emitting diodes and the plurality of third light-emitting diodes, a transparent conductive bus line electrically connected to one sub-pixel circuit from among the plurality of sub-pixel circuits and extending from the third display area towards the second display area in a first direction, and a first branch transparent conductive bus line (which may refer to the first branch conductive bus line hereinafter) and a second branch transparent conductive bus line (which may refer to the second branch conductive bus line hereinafter), which are electrically connected to the transparent conductive bus line, wherein first electrodes of k' second light-emitting diodes emitting light of a first color from among the plurality of second light-emitting diodes are electrically connected to each other, wherein k' is a natural number greater than 1, the first branch transparent conductive bus line is electrically connected to a first electrode of a first second light-emitting diode of the first color from among the k' second light-emitting diodes emitting the light of the first color, and the second branch transparent conductive bus line is electrically connected to a first electrode of a $k'^{th}$ second light-emitting diode of the first color from among the k' second light-emitting diodes emitting the light of the first color.

According to some embodiments, each of the first branch transparent conductive bus line and the second branch transparent conductive bus line may include a transparent conductive material.

According to some embodiments, each of the first electrodes of the k' second light-emitting diodes emitting the light of the first color may include a plurality of sub-layers.

According to some embodiments, from among k' second light-emitting diodes emitting the light of the first color, a first electrode of an $i^{th}$ second light-emitting diode may be electrically connected to a first electrode of an $(i+1)^{th}$ second light-emitting diode through a connection line, wherein i is a natural number smaller than k' and greater than 0, and the connection line may be integrally coupled to one sub-layer from among the plurality of sub-layers of the second light-emitting diode connected to the connection line.

According to some embodiments, the connection line may include a crystalized indium tin oxide.

According to some embodiments, a length of the first branch transparent conductive bus line may be greater than a length of the second branch transparent conductive bus line, and a width of the first branch transparent conductive bus line may be greater than a width of the second branch transparent conductive bus line.

According to some embodiments, the display panel may further include at least one insulating layer above the first branch transparent conductive bus line and the second branch transparent conductive bus line and below the first electrodes, wherein the first branch transparent conductive bus line may be electrically connected to the first electrode of the first second light-emitting diode of the first color through a first contact hole of the at least one insulating layer, and the second branch transparent conductive bus line may be electrically connected to the first electrode of the k" second light-emitting diode of the first color through a second contact hole of the at least one insulating layer.

According to one or more embodiments, an electronic device includes a display panel according to the above-described embodiments, and a component below the display panel.

According to some embodiments, the component may include a sensor or a camera.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
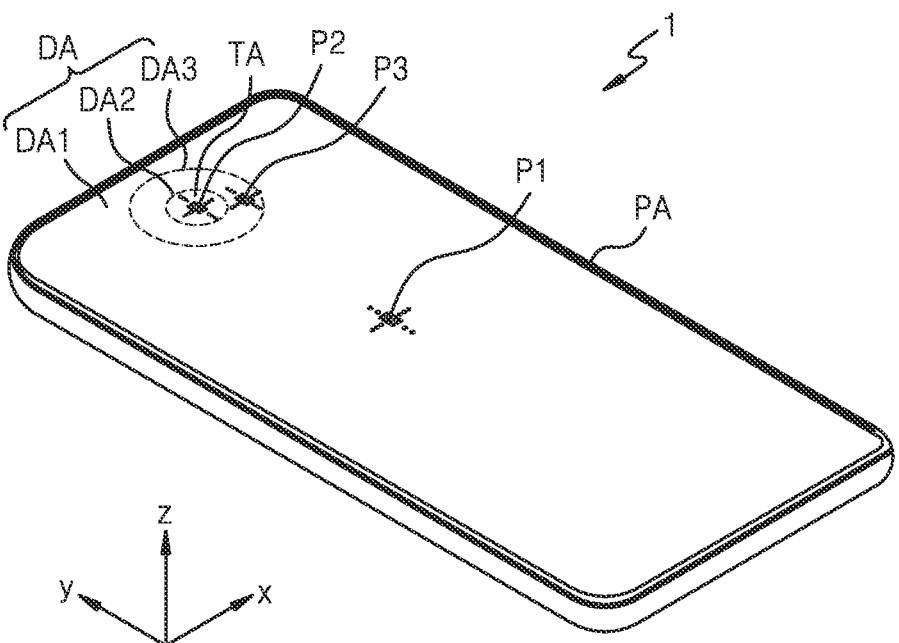
FIG. 1 is a perspective view schematically showing an electronic device according to some embodiments.

The disclosure may have various modifications and various embodiments, and specific embodiments are illustrated in the drawings and are described in detail in the detailed description. Effects and features of embodiments according to the present disclosure and methods of achieving the same will become apparent with reference to embodiments described in detail with reference to the drawings. However, embodiments according to the present disclosure are not limited to the embodiments described below, and may be implemented in various forms.

Hereinafter, aspects of some embodiments will be described in more detail with reference to the accompanying drawings, and in the following description with reference to the drawings, like reference numerals refer to like elements and redundant descriptions thereof will be omitted.

In the following embodiments, the terms "first" and "second" are not used in a limited sense and are used to distinguish one component from another component.

In the following embodiments, an expression used in the singular encompasses the expression of the plural, unless it has a clearly different meaning in the context.

In the following embodiments, it will be further understood that the terms "comprise" and/or "comprising" used herein specify the presence of stated features or components, but do not preclude the presence or addition of one or more other features or components.

It will be understood that when a layer, region, or element is referred to as being "formed on" another layer, area, or element, it can be directly or indirectly formed on the other layer, region, or element. That is, for example, intervening layers, regions, or elements may be present.

In the drawings, for convenience of description, sizes of components may be exaggerated or reduced. In other words, because sizes and thicknesses of components in the drawings are arbitrarily illustrated for convenience of explanation, the disclosure is not necessarily limited thereto.

When a certain embodiment may be implemented differently, a specific process order may be performed differently from the described order. For example, two consecutively described processes may be performed substantially at the same time or performed in an order opposite to the described order.

In the specification, "A and/or B" denotes only A, only B, or both A and B. Also, "at least one of A and B" or "at least one of A or B" denotes only A, only B, or both A and B.

When a layer, region, component, or the like is connected to another layer, region, component, or the like, the layer, the region, the component, or the like may be directly connected thereto and/or may be indirectly connected thereto with an intervening layer, region, component, or the like therebetween. For example, in the specification, when a layer, region, component, or the like is electrically connected to another layer, region, component, or the like, the layer, region, component, or the like may be directly electrically connected thereto and/or may be indirectly electrically connected thereto with an intervening layer, region, component, or the like therebetween.

An x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

FIG. 1 is a perspective view schematically showing an electronic device 1 according to some embodiments.

Referring to FIG. 1, the electronic device 1 may include a display area DA and a peripheral area PA located outside (e.g., in a periphery or outside a footprint of) the display area DA. The display area DA may display images at sub-pixels. The peripheral area PA is a non-display area that is arranged outside the display area DA and does not display images, and may entirely surround the display area DA. A driver or the like for providing an electric signal or power to the display area DA may be arranged in the peripheral area PA. A pad that is a region to which an electronic device or a printed circuit board may be electrically connected may be arranged in the peripheral area PA.

Hereinafter, for convenience of description, the electronic device 1 is a smart phone, but the electronic device 1 of embodiments according to the present disclosure is not limited thereto. The electronic device 1 may be applied not only to a portable electronic device, such as a mobile phone, a smart phone, a tablet personal computer (PC), a mobile communication terminal, an electronic notebook, an electronic book, a portable multimedia player (PMP), a navigation device, or an ultra mobile PC (UMPC), but also to any type of product, such as a television, a laptop computer, a monitor, a billboard, or an Internet of things (IoT)-based device. Also, the electronic device 1 according to some embodiments may be applied to a wearable device, such as a smart watch, a watch phone, a glasses-type display, or a head mounted display (HMD). In addition, the electronic device 1 according to some embodiments may be applied to a panel of a vehicle, a center information display (CID) arranged on a center fascia or dashboard of a vehicle, a room mirror display replacing a side mirror of a vehicle, or a display arranged on a rear surface of a front seat, as entertainment for a back seat of a vehicle.

The display area DA may include a first display area DA1, a second display area DA2, and a third display area DA3. The display area DA may display images by using sub-pixels arranged 2-dimensionally. The sub-pixels may include first sub-pixels P1 arranged in the first display area DA1, second sub-pixels P2 arranged in the second display area DA2, and third sub-pixels P3 arranged in the third display area DA3.

The first display area DA1 may occupy the most area of the display area DA. Occupying the most area may indicate that the area of the first display area DA1 is equal to or greater than about 50% of the area of the display area DA. The second display area DA2 may be arranged inside the display area DA. For example, the second display area DA2 may be entirely surrounded by the first display area DA1. The third display area DA3 may be arranged between the first display area DA1 and the second display area DA2. The third display area DA3 may entirely surround the second display area DA2, and may be entirely surrounded by the first display area DA1.

Each of the second display area DA2 and the third display area DA3 may have an area smaller than the first display area DA1. According to some embodiments, FIG. 1 illustrates that the second display area DA2 and the third display area DA3 each have a circular shape. According to some embodiments, the second display area DA2 and the third display area DA3 may each have an approximately rectangular shape.

In FIG. 1, the second display area DA2 and the third display area DA3 are arranged at an upper center (in a +y direction) of the display area DA having an approximately rectangular shape, when viewed in a direction approximately perpendicular or normal (e.g., when viewed in a plan view) to a top surface of the electronic device 1, but embodiments according to the present disclosure are not limited thereto. The second display area DA2 and the third display area DA3 may be arranged, for example, at an upper right or upper left side of the display area DA.

The second display area DA2 may display images through the second sub-pixels P2, and transmit light or sound through a region between the second sub-pixels P2. Hereinafter, a region at which light or sound may penetrate is referred to as a transmission area TA. In other words, the second display area DA2 may include the transmission area TA between the second sub-pixels P2.

Figure 2:
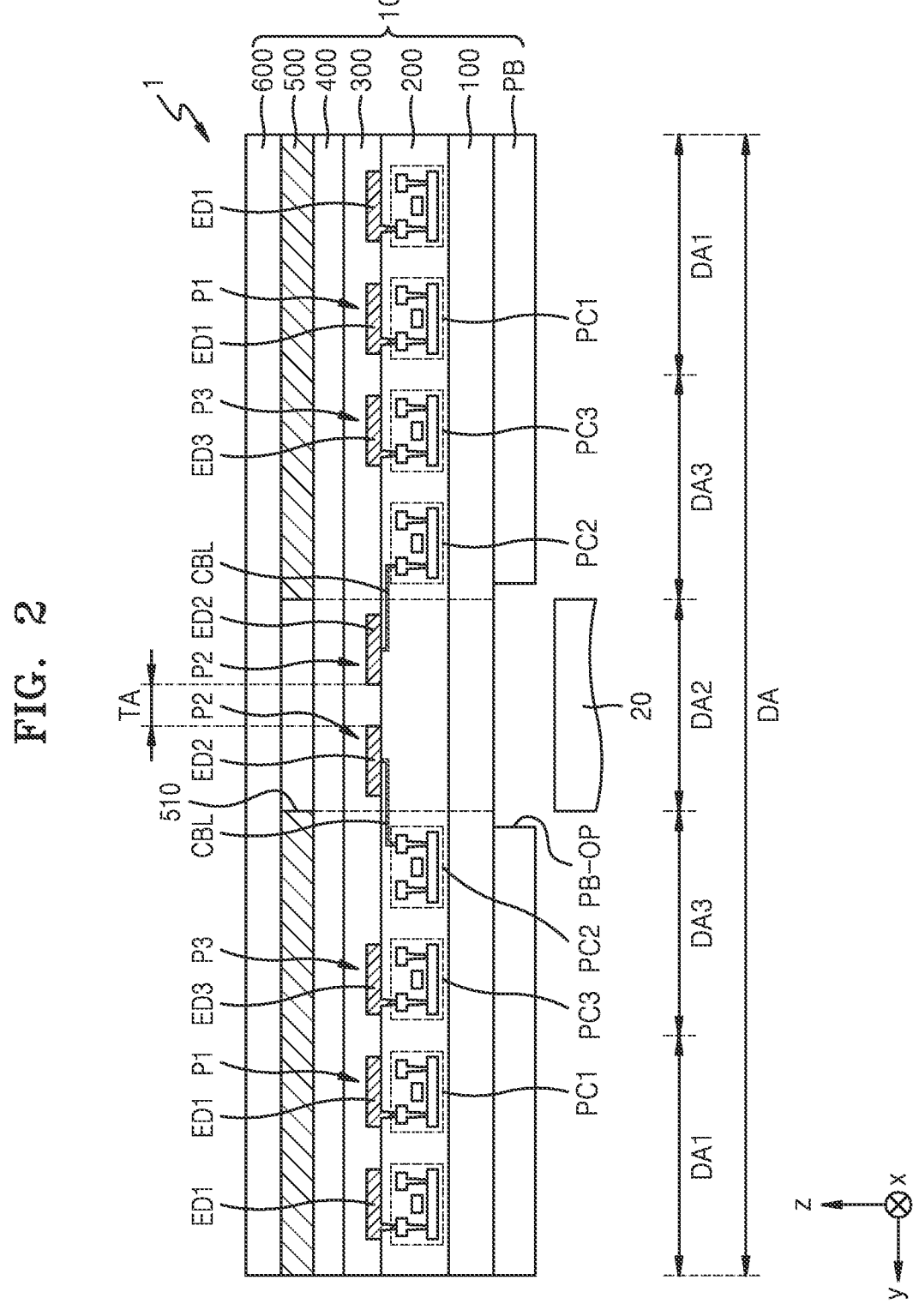
FIG. 2 is a cross-sectional view schematically showing an electronic device according to some embodiments.

FIG. 2 is a cross-sectional view schematically showing the electronic device 1 according to some embodiments.

Referring to FIG. 2, the electronic device 1 may include a display panel 10 and a component 20 overlapping the display panel 10. The component 20 may be arranged in the second display area DA2.

The component 20 may be an electronic element using light or sound. For example, the electronic element may be a sensor measuring a distance, such as a proximity sensor, a sensor recognizing a part (for example, a fingerprint, an iris, or a face) of a body of a user, a small lamp outputting light, or an image sensor (for example, a camera) capturing an image. The electronic element using light may use light of various wavelength bands, such as visible light, infrared light, or ultraviolet light. The electronic element using sound may use ultrasonic waves or sound in another frequency band.

The second display area DA2 may include the transmission area TA through which light and/or sound output to the outside from the component 20 or proceeding from the outside towards the component 20 may penetrate. According to some embodiments, the transmission area TA is a region where light may penetrate, and may correspond to a region between the second sub-pixels P2. In the electronic device 1 according to some embodiments, when light is transmitted through the second display area DA2 including the transmission area TA, light transmittance may be equal to or greater than about 10%, equal to or greater than 25%, equal to or greater than 40%, equal to or greater than 50%, equal to or greater than 85%, or equal to or greater than 90%.

Each of the first sub-pixel P1, the second sub-pixel P2, and the third sub-pixel P3, which are described above with reference to FIG. 1, may emit light by using a light-emitting diode, and each light-emitting diode may be arranged in the display area DA of the display panel 10. In this regard, a light-emitting diode corresponding to the first sub-pixel P1 of the first display area DA1 may be referred to as a first light-emitting diode ED1, a light-emitting diode corresponding to the second sub-pixel P2 of the second display area DA2 may be referred to as a second light-emitting diode ED2, and a light-emitting diode corresponding to the third sub-pixel P3 of the third display area DA3 may be referred to as a third light-emitting diode ED3. The first through third light-emitting diodes ED1 through ED3 may be located on a substrate 100.

The substrate 100 may include an insulating material, such as a glass material or polymer resin, and a protection film PB may be located on a rear surface of the substrate 100. The substrate 100 may be a rigid substrate or a flexible substrate capable of being bent, folded, or rolled. The protection film PB may include an opening PB-OP located in the second display area DA2 to enhance transmittance of the transmission area TA. A sub-pixel circuit layer 200 including a first sub-pixel circuit PC1, a second sub-pixel circuit PC2 and a third sub-pixel circuit PC1 may be located on a front surface of the substrate 100.

The first light-emitting diode ED1 is arranged in the first display area DA1 and is electrically connected to a first sub-pixel circuit PC1 arranged in the first display area DA1. The first sub-pixel circuit PC1 may include transistors and a storage capacitor electrically connected to the transistors.

The second light-emitting diode ED2 is arranged in the second display area DA2. The second light-emitting diode ED2 is electrically connected to a second sub-pixel circuit PC2, and the second sub-pixel circuit PC2 is not arranged in the second display area DA2 so as to enhance the transmittance and transmissive surface area of the transmission area TA provided in the second display area DA2. The second sub-pixel circuit PC2 is arranged in the third display area DA3, and the second light-emitting diode ED2 may be electrically connected to the second sub-pixel circuit PC2 through a transparent conductive bus line CBL.

The transparent conductive bus line CBL may electrically connect the second sub-pixel circuit PC2 of the third display area DA3 and the second light-emitting diode ED2 of the second display area DA2 to each other. The transparent conductive bus line CBL may include a light-transmitting material, for example, a transparent conductive oxide (TCO). The TCO may include indium tin oxide (ITO), indium zinc oxide (IZO), zinc oxide (ZnO), indium oxide ($In_2O_3$), indium gallium oxide (IGO), and/or aluminum zinc oxide (AZO).

The third light-emitting diode ED3 is arranged in the third display area DA3 and is electrically connected to a third sub-pixel circuit PC3 arranged in the third display area DA3. The third sub-pixel circuit PC3 may include transistors and a storage capacitor electrically connected to the transistors.

The first through third light-emitting diodes ED1 through ED3 are light-emitting elements that emit light of a certain color, and may include organic light-emitting diodes. According to some embodiments, the first through third light-emitting diodes ED1 through ED3 may include inorganic light-emitting diodes or may be light-emitting diodes including quantum dots.

The first through third light-emitting diodes ED1 through ED3 may be covered by an encapsulation layer 300. The encapsulation layer 300 may be a thin-film encapsulation layer including an inorganic encapsulation layer including an inorganic insulating material, and an organic encapsulation layer including an organic insulating material. According to some embodiments, the encapsulation layer 300 may include first and second inorganic encapsulation layers and an organic encapsulation layer therebetween.

According to some embodiments, the encapsulation layer 300 may be an encapsulation substrate of a glass material. A sealant including frit or the like may be arranged between the substrate 100 and the encapsulation substrate. The sealant may be located in the peripheral area PA (refer to FIG. 1) while extending to surround an outer edge of the display area DA, thereby preventing or reducing instances of contaminants or moisture penetrating into the first through third light-emitting diodes ED1 through ED3 through a side surface.

An input detection layer 400 may be located on the encapsulation layer 300. The input detection layer 400 may obtain coordinate information according to an external input, for example, a touch event of an object, such as a finger or a stylus pen. The input detection layer 400 may include a touch electrode and trace wires connected to the touch electrode. The input detection layer 400 may detect an external input via a mutual cap method or a self-cap method.

An optical functional layer 500 may include an antireflection layer. The antireflection layer may reduce reflectance of light (external light) incident from the outside towards the display panel 10 through a cover window 600. The antireflection layer may include a retarder and a polarizer. When the optical functional layer 500 includes the polarizer, the optical functional layer 500 may include an opening 510 located in the second display area DA2, thereby enhancing transmittance of the transmission area TA.

According to some embodiments, the antireflection layer may include a black matrix and color filters. The color filters may be arranged considering a color of light emitted from each of the first through third light-emitting diodes ED1 through ED3. When the optical functional layer 500 includes the black matrix and the color filters, a light-transmitting material may be arranged at a location corresponding to the transmission area TA.

According to some embodiments, the antireflection layer may include a destructive interference structure. The destructive interference structure may include a first reflective layer and a second reflective layer arranged on different layers. A first reflective light and a second reflective light reflected respectively from the first reflective layer and the second reflective layer may destructively interfere with each other, and accordingly, reflectance of an external light may be reduced.

The cover window 600 may be located on the optical functional layer 500. The cover window 600 may be combined with the optical functional layer 500 through an adhesive layer, such as an optically clear adhesive, arranged between the cover window 600 and the optical functional layer 500. The cover window 600 may include a glass material or a plastic material. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate.

The cover window 600 may include a flexible cover window. For example, the cover window 600 may include polyimide and/or ultra-thin glass.

Figure 3:
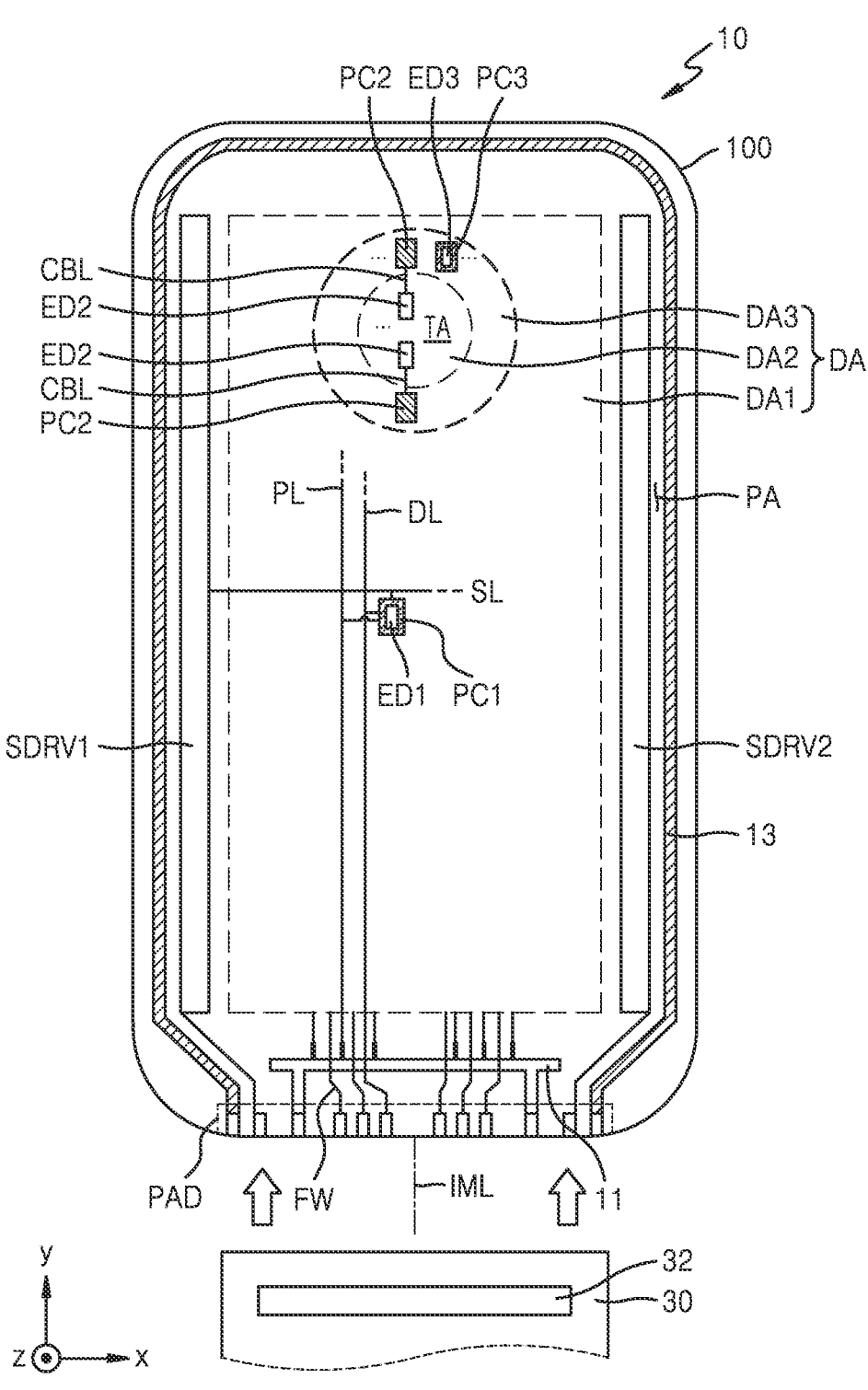
FIG. 3 is a plan view schematically illustrating a display panel according to some embodiments.

FIG. 3 is a plan view schematically illustrating the display panel 10 according to some embodiments.

Referring to FIG. 3, the display panel 10 may include the display area DA and the peripheral area PA. The display area DA may include the first display area DA1, the second display area DA2, and the third display area DA3. The display area DA, for example, the first display area DA1, second display area DA2, and third display area DA3, may correspond to an image surface of the display panel 10. The second and third display areas DA2 and DA3 may be spaced apart from a virtual line IML passing through a center of the display area DA and/or a center of the image surface. For example, a center of the second display area DA2 and a center of the third display area DA3 may be arranged on the virtual line IML passing through the center of the display area DA and/or the center of the image surface as shown in FIG. 3, but according to some embodiments, the centers of the second and third display areas DA2 and DA3 may be spaced apart from the virtual line IML in a left or right direction.

Light-emitting diodes are arranged in the first through third display areas DA1 through DA3, and sub-pixel circuits electrically connected to the light-emitting diodes respectively are arranged in the first display area DA1 and the third display area DA3, but are not arranged in the second display area DA2. For example, the first sub-pixel circuits PC1 electrically connected to the first light-emitting diodes ED1 arranged in the first display area DA1 are arranged in the first display area DA1, and the second and third sub-pixel circuits PC2 and PC3 electrically connected to the second and third light-emitting diodes ED2 and ED3 arranged in the second and third display areas DA2 and DA3 may be arranged in the third display area DA3.

In other words, a portion (for example, the second sub-pixel circuits PC2) of sub-pixel circuits arranged in the third display area DA3 may be electrically connected to the second light-emitting diodes ED2 arranged in the second display area DA2, and another portion (for example, the third sub-pixel circuits PC3) of the sub-pixel circuits arranged in the third display area DA3 may be electrically connected to the third light-emitting diodes ED3 arranged in the third display area DA3. Hereinafter, for convenience of descriptions, sub-pixel circuits electrically connected to the second light-emitting diodes ED2 from among the sub-pixel circuits arranged in the third display area DA3 are referred to as the second sub-pixel circuits PC2, and sub-pixel circuits electrically connected to the third light-emitting diodes ED3 from among the sub-pixel circuits arranged in the third display area DA3 are referred to as the third sub-pixel circuits PC3.

The first light-emitting diode ED1 is arranged in the first display area DA1. Light emitted from the first light-emitting diode ED1 corresponds to light of the first sub-pixel P1 of FIG. 1 described with reference to FIG. 1, and a location of the first light-emitting diode ED1 may be a location of the first sub-pixel P1 of FIG. 1. The first light-emitting diode ED1 may emit, for example, red, green, or blue light. The first sub-pixel circuit PC1 driving the first light-emitting diode ED1 may be arranged in the first display area DA1 and electrically connected to the first light-emitting diode ED1.

The first sub-pixel circuit PC1 is electrically connected to a scan line SL extending in a first direction (for example, an x direction), and a data line DL extending in a second direction (for example, a y direction). A first driving circuit SDRV1 and a second driving circuit SDRV2 for providing a signal to each first sub-pixel circuit PC1 may be arranged in the peripheral area PA.

The first driving circuit SDRV1 may apply a scan signal to each of the first sub-pixel circuits PC1 through the scan line SL. The second driving circuit SDRV2 may be located opposite to the first driving circuit SDRV1 based on the first display area DA1 therebetween. Some of the first sub-pixel circuits PC1 of the first display area DA1 may be electrically connected to the first driving circuit SDRV1 and the remaining ones may be electrically connected to the second driving circuit SDRV2.

A pad PAD may be arranged at one side of the substrate 100. The pad PAD may not be covered by an insulating layer, but may be exposed and connected to a circuit board 30. A control driving unit 32 may be arranged in the circuit board 30.

The control driving unit 32 may be configured to generate a control signal transmitted to the first driving circuit SDRV1 and the second driving circuit SDRV2. The control driving unit 32 may include a data driving circuit and the data driving circuit may be configured to generate a data signal. The generated data signal may be transmitted to the first sub-pixel circuits PC1 through a fanout wire FW arranged in the peripheral area PA of the display panel 10, and the data line DL connected to the fanout wire FW. According to some embodiments, the data driving circuit may be arranged in the peripheral area PA of the substrate 100.

The second light-emitting diode ED2 is arranged in the second display area DA2. Light emitted from the second light-emitting diode ED2 corresponds to light of the second sub-pixel P2 of FIG. 1 described with reference to FIG. 1, and a location of the second light-emitting diode ED2 may be a location of the second sub-pixel P2 of FIG. 1. The second light-emitting diode ED2 may emit, for example, red, green, or blue light.

The transmission area TA may be arranged between the second light-emitting diodes ED2. According to some embodiments, a region of the second display area DA2, where the second light-emitting diodes ED2 are not arranged, may correspond to the transmission area TA. To increase the area and enhance the transmittance of the transmission area TA, the second sub-pixel circuit PC2 for driving the second light-emitting diode ED2 may be arranged in the third display area DA3 outside the second display area DA2. A portion of the second sub-pixel circuits PC2 may be arranged in a partial region of the third display area DA3 adjacent to the top of the second display area DA2, and another portion of the second sub-pixel circuits PC2 may be arranged in a partial region of the third display area DA3 adjacent to the bottom of the second display area DA2.

The second sub-pixel circuit PC2 in the third display area DA3 may be electrically connected to the second light-emitting diode ED2 in the second display area DA2, through the transparent conductive bus line CBL. The second light-emitting diode ED2 may be electrically connected to the second sub-pixel circuit PC2 through the transparent conductive bus line CBL extending in the second direction (for example, the y direction).

The third light-emitting diode ED3 may be arranged in the third display area DA3. Light emitted from the third light-emitting diode ED3 corresponds to light of the third sub-pixel P3 of FIG. 1 described with reference to FIG. 1, and a location of the third light-emitting diode ED3 may be a location of the third sub-pixel P3 of FIG. 1. The third light-emitting diode ED3 may emit, for example, red, green, or blue light.

The third sub-pixel circuit PC3 for driving the third light-emitting diode ED3 is arranged in the third display area DA3. The third sub-pixel circuit PC3 is electrically connected to the third light-emitting diode ED3 and may operate the third light-emitting diode ED3.

The second sub-pixel circuit PC2 and the third sub-pixel circuit PC3 may be electrically connected to the first driving circuit SDRV1 and/or the second driving circuit SDRV2. At least one second sub-pixel circuit PC2 and/or at least one third sub-pixel circuit PC3 may share a scan line with at least one first sub-pixel circuit PC1. At least one second sub-pixel circuit PC2 and/or at least one third sub-pixel circuit PC3 may share a data line with at least one first sub-pixel circuit PC1.

A driving voltage supply line 11 and a common voltage supply line 13 may be arranged in the peripheral area PA. The driving voltage supply line 11 may apply a driving voltage to each sub-pixel circuit, for example, each of the first through third sub-pixel circuits PC1 through PC3, and the common voltage supply line 13 may apply a common voltage to a second electrode (cathode) of each light-emitting diode, for example, each of the first through third light-emitting diodes ED1 through ED3.

The driving voltage supply line 11 may be arranged between the pad PAD and one side of the display area DA. The common voltage supply line 13 may have a loop shape with one opened side, and partially surround the display area DA in a plan view. The driving voltage supply line 11 may be electrically connected to a driving voltage line PL passing through the display area DA.

The first through third light-emitting diodes ED1 through ED3, the first through third sub-pixel circuits PC1 through PC3, the pad PAD, the first and second driving circuits SDRV1 and SDRV2, the driving voltage supply line 11, and the common voltage supply line 13 are located on the substrate 100. A shape of the display panel shown in FIG. 3 may be substantially the same as a shape of the substrate 100. Accordingly, the display panel 10 including the display area DA and the peripheral area PA may indicate that the substrate 100 includes the display area DA and the peripheral area PA.

Figure 4:
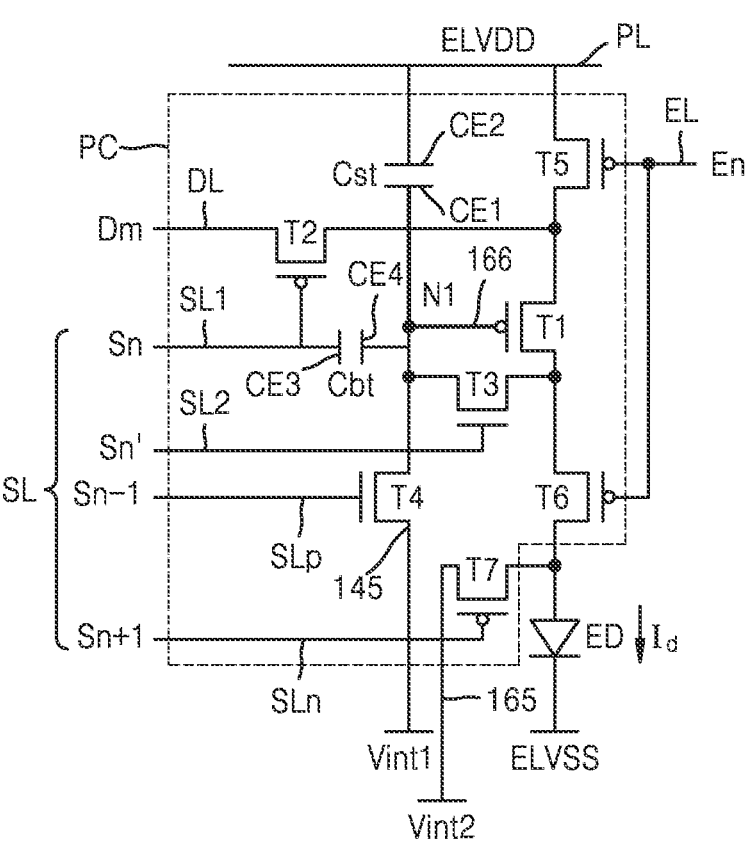
FIG. 4 is an equivalent circuit diagram schematically showing a sub-pixel circuit electrically connected to a light-emitting diode of a display panel, according to some embodiments.

FIG. 4 is an equivalent circuit diagram schematically showing a sub-pixel circuit PC electrically connected to a light-emitting diode ED of a display panel, according to some embodiments. The light-emitting diode ED of FIG. 4 may correspond to the first through third light-emitting diodes ED1 through ED3 described above with reference to FIG. 3, and the sub-pixel circuit PC of FIG. 4 may correspond to the first through third sub-pixel circuits PC1 through PC3 described above with reference to FIG. 3.

In other words, an equivalent circuit diagram of the first light-emitting diode ED1 of FIG. 3 and the first sub-pixel circuit PC1, an equivalent circuit diagram of the second light-emitting diode ED2 of FIG. 3 and the second sub-pixel circuit PC2, and an equivalent circuit diagram of the third light-emitting diode ED3 of FIG. 3 and the third sub-pixel circuit PC3 may be the same. As described above, the light-emitting diode ED may include an organic light-emitting diode, an inorganic light-emitting diode, or a quantum dot light-emitting diode.

The light-emitting diode ED may be electrically connected to the sub-pixel circuit PC. Referring to FIG. 4, the sub-pixel circuit PC may include first through seventh transistors T1 through T7, a storage capacitor Cst, and a boost capacitor Cbt. According to some embodiments, the sub-pixel circuit PC may not include the boost capacitor Cbt, and hereinafter, for convenience of descriptions, the sub-pixel circuit PC includes the boost capacitor Cbt. Additionally, in some embodiments according to the present disclosure, the sub-pixel circuit PC may include additional components or fewer components without departing from the spirit and scope of embodiments according to the present disclosure.

Some of the first through seventh transistors T1 through T7 may be n-channel MOSFETs (NMOSs) and the remaining ones may be p-channel MOSFETs (PMOSs). For example, as shown in FIG. 4, the third and fourth transistors T3 and T4 may be NMOSs and the remaining ones may be PMOSs. According to some embodiments, the third, fourth, and seventh transistors T3, T4, and T7 may be NMOSs and the remaining ones may be PMOSs. Alternatively, only one of the first through seventh transistors T1 through T7 may be an NMOS and the remaining ones may be PMOSs.

The first through seventh transistors T1 through T7, the storage capacitor Cst, and the boost capacitor Cbt may be connected to a signal line. The signal line may include the scan line SL, an emission control line EL, and the data line DL. The scan line SL may include a first scan line SL1 configured to transmit a first scan signal Sn, a second scan line SL2 configured to transmit a second scan signal Sn', a previous scan line SLp configured to transmit a previous scan signal Sn−1, and a next scan line SLn configured to transmit a next scan signal Sn+1.

The driving voltage line PL is configured to transmit a driving voltage ELVDD to the first transistor T1, and first and second initialization voltage lines 145 and 165 may be configured to transmit first and second initialization voltages Vint1 and Vint2, respectively.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (for example, an anode) of the light-emitting diode ED through the sixth transistor T6. One of the first electrode and second electrode of the first transistor T1 may be a source electrode and the other one may be a drain electrode. The first transistor T1 may supply a driving current Id to the light-emitting diode ED according to a switching operation of the second transistor T2.

The second transistor T2 may be a switching transistor. A second gate electrode of the second transistor T2 may be connected to the first scan line SL1, a first electrode of the second transistor T2 may be connected to the data line DL, and a second electrode of the second transistor T2 may be connected to the first electrode of the first transistor T1 while being electrically connected to the driving voltage line PL through the fifth transistor T5. One of the first electrode and second electrode of the second transistor T2 may be a source electrode and the other one may be a drain electrode. The second transistor T2 may be turned on according to the first scan signal Sn received through the first scan line SL1 to perform the switching operation of transmitting a data signal Dm transmitted to the data line DL, to the first electrode of the first transistor T1.

The third transistor T3 may be a compensation transistor configured to compensate for a threshold voltage of the first transistor T1. A third gate electrode of the third transistor T3 is connected to the second scan line SL2. A first electrode of the third transistor T3 is connected to the first gate electrode of the first transistor T1 and a lower electrode CE1 of the storage capacitor Cst, through a node connection line 166.

The first electrode of the third transistor T3 may be connected to the fourth transistor T4. A second electrode of the third transistor T3 may be connected to the second electrode of the first transistor T1 while being electrically connected to the first electrode (for example, an anode) of the light-emitting diode ED through the sixth transistor T6. One of the first electrode and second electrode of the third transistor T3 may be a source electrode and the other one may be a drain electrode.

The third transistor T3 may be turned on according to the second scan signal Sn' (for example, a compensation control signal) received through the second scan line SL2 to electrically connect the second electrode to the first gate electrode of the first transistor T1, thereby diode-connecting the first transistor T1.

The fourth transistor T4 may be a first initialization transistor configured to initialize the first gate electrode of the first transistor T1. A fourth gate electrode of the fourth transistor T4 is connected to the previous scan line SLp. The first electrode of the fourth transistor T4 is connected to the first initialization voltage line 145. A second electrode of the fourth transistor T4 may be connected to the lower electrode CE1 of the storage capacitor Cst, the first electrode of the third transistor T3, and the first gate electrode of the first transistor T1.

One of the first electrode and second electrode of the fourth transistor T4 may be a source electrode and the other one may be a drain electrode. The fourth transistor T4 may be turned on according to the previous scan signal Sn−1 received through the previous scan line SLp, and perform an initialization operation of initializing a voltage of the first gate electrode of the first transistor T1 by transmitting the first initialization voltage Vint1 to the first gate electrode of the first transistor T1.

The fifth transistor T5 may be an operation control transistor. A fifth gate electrode of the fifth transistor T5 may be connected to the emission control line EL, a first electrode of the fifth transistor T5 may be connected to the driving voltage line PL, and a second electrode of the fifth transistor T5 may be connected to the first electrode of the first transistor T1 and the second electrode of the second transistor T2. One of the first electrode and second electrode of the fifth transistor T5 may be a source electrode and the other one may be a drain electrode.

The sixth transistor T6 may be an emission control transistor. A sixth gate electrode of the sixth transistor T6 may be connected to the emission control line EL, a first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the first electrode (for example, an anode) of the light-emitting diode ED. One of the first electrode and second electrode of the sixth transistor T6 may be a source electrode and the other one may be a drain electrode.

The fifth transistor T5 and the sixth transistor T6 may be simultaneously turned on according to an emission control signal En received through the emission control line EL to transmit the driving voltage ELVDD to the light-emitting diode ED such that the driving current Id flows in the light-emitting diode ED.

The seventh transistor T7 may be a second initialization transistor configured to initialize the first electrode (for example, an anode) of the light-emitting diode ED. A seventh gate electrode of the seventh transistor T7 is connected to the next scan line SLn. A first electrode of the seventh transistor T7 is connected to the second initialization voltage line 165. The second electrode of the seventh transistor T7 is connected to the second electrode of the sixth transistor T6 and the first electrode (for example, an anode) of the light-emitting diode ED. The seventh transistor T7 may be turned on according to the next scan signal Sn+1 received through the next scan line SLn to transmit the second initialization voltage Vint2 to the first electrode (for example, an anode) of the light-emitting diode ED so as to initialize the first electrode of the light-emitting diode ED. In FIG. 4, the seventh transistor T7 is connected to the next scan line SLn, but the seventh transistor T7 may be connected to the previous scan line SLp.

The storage capacitor Cst may include the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store charges corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the first scan line SL1 and the second gate electrode of the second transistor T2, and the fourth electrode CE4 may be connected to the node connection line 166 and the first electrode of the third transistor T3. When the first scan signal Sn supplied to the first scan line SL1 is turned off (e.g., an off level), the boost capacitor Cbt may raise a voltage of a first node N1, and when the voltage of the first node N1 is raised, black gradation may be clearly represented.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

According to some embodiments, in FIG. 4, the third and fourth transistors T3 and T4 are NMOSs, and the first, second, fifth, sixth, and seventh transistors T1, T2, T5, T6, and T7 are PMOSs. The first transistor T1 that directly affects brightness of the display device includes a semiconductor layer including polycrystalline silicon having high reliability so that the display device having high resolution is realized.

In FIG. 4, the third and fourth transistors T3 and T4 are NMOSs, but according to some embodiments, the first through seventh transistors T1 through T7 may be PMOSs. In this case, the second and third transistors T2 and T3 may be electrically connected to a same scan line. According to some embodiments, the fourth and seventh transistors T4 and T7 may also be electrically connected to a same scan line. According to some embodiments, the fourth and seventh transistors T4 and T7 may be electrically connected to a same initialization voltage line.

Figure 5:
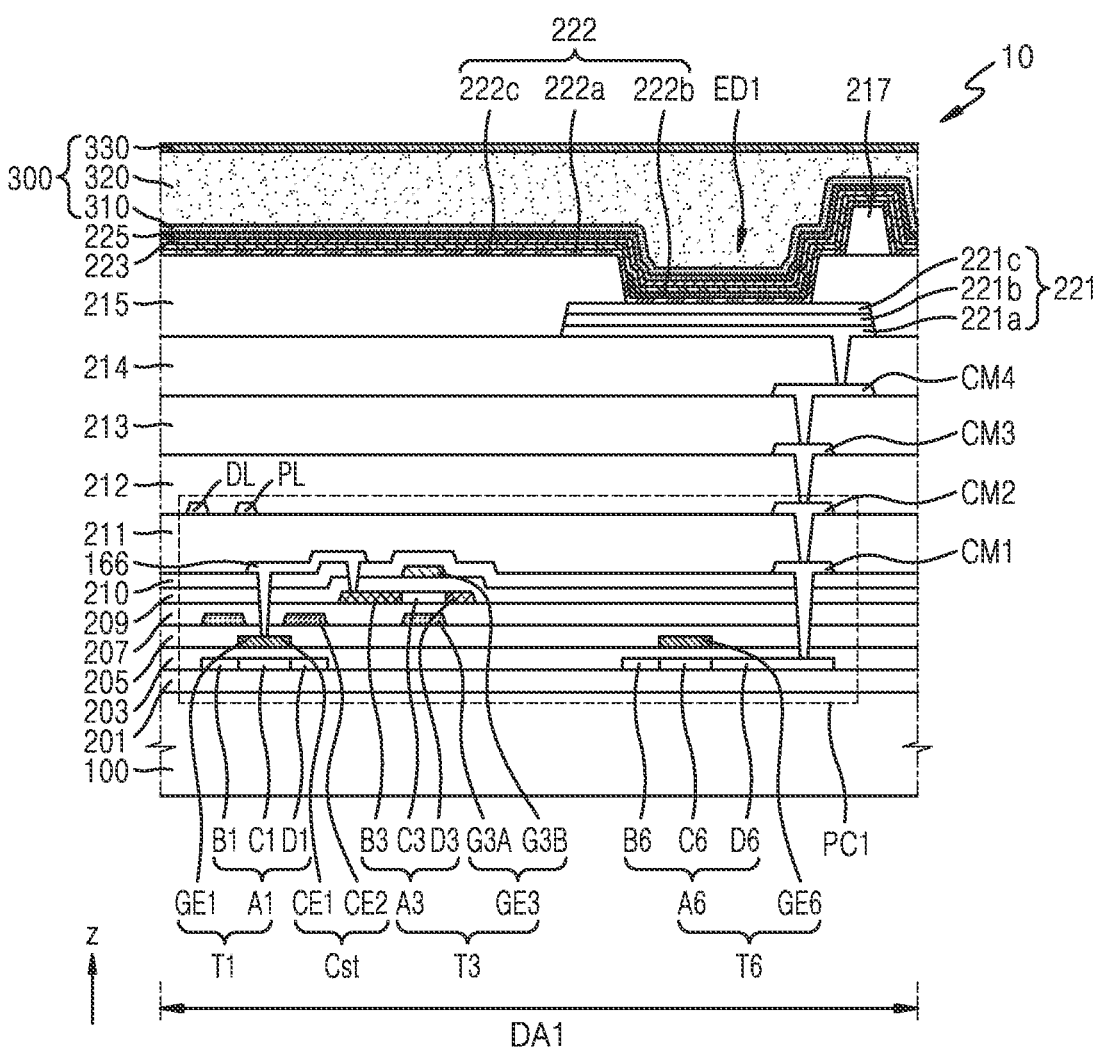
FIG. 5 is a cross-sectional view showing an electric connection between a first sub-pixel circuit and a first light-emitting diode of a display panel, according to some embodiments.

FIG. 5 is a cross-sectional view showing an electric connection between the first sub-pixel circuit PC1 and the first light-emitting diode ED1 of the display panel 10, according to some embodiments.

Referring to FIG. 5, the first sub-pixel circuit PC1 located on the substrate 100, and the first light-emitting diode ED1 on the first sub-pixel circuit PC1 may be located in the first display area DA1 of the display panel 10. As described above with reference to FIG. 2, the substrate 100 may include a glass material or polymer resin.

A buffer layer 201 may be located on the substrate 100. The buffer layer 201 may prevent or reduce instances of contaminants or impurities penetrating into a semiconductor layer of a transistor. The buffer layer 201 may include an inorganic insulating material, such as silicon nitride, silicon oxynitride, or silicon oxide, and may be a single layer or multilayer including the above inorganic insulating material.

The first sub-pixel circuit PC1 may be arranged on the buffer layer 201. As described above with reference to FIG. 4, the first sub-pixel circuit PC1 may include a plurality of thin-film transistors and a storage capacitor. In this regard, FIG. 5 illustrates the first transistor T1, the third transistor T3, the sixth transistor T6, and the storage capacitor Cst.

The first transistor T1 may include a first semiconductor layer A1 on the buffer layer 201, and a first gate electrode GE1 overlapping a channel region C1 of the first semiconductor layer A1. The first semiconductor layer A1 may include a silicon-based semiconductor material, for example, polysilicon. The first semiconductor layer A1 may include the channel region C1, and a first region B1 and a second region D1, which are arranged on both sides of the channel region C1. The first region B1 and the second region D1 are regions including higher concentration of impurities than the channel region C1, and one of the first region B1 and the second region D1 may correspond to a source region and the other one may correspond to a drain region.

The sixth transistor T6 may include a sixth semiconductor layer A6 on the buffer layer 201, and a sixth gate electrode GE6 overlapping a channel region C6 of the sixth semiconductor layer A6. The sixth semiconductor layer A6 may include a silicon-based semiconductor material, for example, polysilicon. The sixth semiconductor layer A6 may include the channel region C6, and a first region B6 and a second region D6, which are arranged on both sides of the channel region C6. The first region B6 and the second region D6 are regions including higher concentration of impurities than the channel region C6, and one of the first region B6 and the second region D6 may correspond to a source region and the other one may correspond to a drain region.

The first gate electrode GE1 and the sixth gate electrode GE6 may include a conductive material including molybdenum (Mo), aluminum (Al), copper (Cu), or titanium (Ti), and may be formed in a single layer or multilayer structure including the conductive material. A first gate insulating layer 203 for electric insulation between the first semiconductor layer A1 and the sixth semiconductor layer A6 may be located below the first gate electrode GE1 and the sixth gate electrode GE6. The first gate insulating layer 203 may include an inorganic insulating material, such as silicon nitride, silicon oxynitride, or silicon oxide, and may be a single layer or multilayer including the above inorganic insulating material.

The storage capacitor Cst may include the lower electrode CE1 and the upper electrode CE2 that overlap each other. According to some embodiments, the lower electrode CE1 of the storage capacitor Cst may include the first gate electrode GE1. In other words, the first gate electrode GE1 may include the lower electrode CE1 of the storage capacitor Cst. For example, the first gate electrode GE1 may be integrated with the lower electrode CE1 of the storage capacitor Cst.

A first interlayer insulating layer 205 may be arranged between the lower electrode CE1 and upper electrode CE2 of the storage capacitor Cst. The first interlayer insulating layer 205 may include an inorganic insulating material, such as silicon oxide, silicon nitride, or silicon oxynitride, and may include a single layer or multilayer structure including the above inorganic insulating material.

The upper electrode CE2 of the storage capacitor Cst may include a low-resistance conductive material such as molybdenum (Mo), aluminum (Al), copper (Cu), and/or titanium (Ti), and may include a single layer or multilayer structure including such a material.

A second interlayer insulating layer 207 may be located on the storage capacitor Cst. The second interlayer insulating layer 207 may include an inorganic insulating material, such as silicon oxide, silicon nitride, or silicon oxynitride, and may include a single layer or multilayer structure including the above inorganic insulating material.

A third semiconductor layer A3 of the third transistor T3 may be located on the second interlayer insulating layer 207. The third semiconductor layer A3 may include an oxide semiconductor. For example, the third semiconductor layer A3 may include, a zinc (Zn) oxide-based material, such as a Zn oxide, an In—Zn oxide, or a Ga—In—Zn oxide. According to some embodiments, the third semiconductor layer A3 may include an In—Ga—Zn—O (IGZO), In—Sn—Zn—O (ITZO), or an In—Ga—Sn—Zn—O (IGTZO) semiconductor, wherein a metal, such as indium (In), gallium (Ga), or tin (Sn) is contained in ZnO.

The third semiconductor layer A3 may include a channel region C3, and a first region B3 and a second region D3, which are arranged on both sides of the channel region C3. One of the first region B3 and the second region D3 may correspond to a source region, and the other one may correspond to a drain region.

The third transistor T3 may include a third gate electrode GE3 overlapping the channel region C3 of the third semiconductor layer A3. The third gate electrode GE3 may include a double gate structure including a lower gate electrode G3A located below the third semiconductor layer A3 and an upper gate electrode G3B arranged on (e.g., above) the channel region C3.

The lower gate electrode G3A may be arranged on a same layer (for example, the first interlayer insulating layer 205) as the upper electrode CE2 of the storage capacitor Cst. The lower gate electrode G3A may include a same material as the upper electrode CE2 of the storage capacitor Cst.

The upper gate electrode G3B may be arranged on the third semiconductor layer A3 with a second gate insulating layer 209 therebetween. The second gate insulating layer 209 may include an inorganic insulating material, such as silicon oxide, silicon nitride, or silicon oxynitride, and may include a single layer or multilayer structure including the above inorganic insulating material.

A third interlayer insulating layer 210 may be located on the upper gate electrode G3B. The third interlayer insulating layer 210 may include an inorganic insulating material such as silicon oxynitride, and may include a single layer or multilayer structure including the above inorganic insulating material.

In FIG. 5, the upper electrode CE2 of the storage capacitor Cst is arranged on a same layer as the lower gate electrode G3A of the third gate electrode GE3, but the disclosure is not limited thereto. According to some embodiments, the upper electrode CE2 of the storage capacitor Cst may be arranged on a same layer as the third semiconductor layer A3, and include a same material as the first region B3 and second region D3 of the third semiconductor layer A3.

The first transistor T1 and the third transistor T3 may be electrically connected to each other through a node connection line 166. The node connection line 166 may be located on the third interlayer insulating layer 210. One side of the node connection line 166 may be connected to the first gate electrode GE1 of the first transistor T1, and the other side of the node connection line 166 may be connected to the first region B3 of the third semiconductor layer A3 of the third transistor T3.

The node connection line 166 may include Al, Cu, and/or Ti, and include a single layer or multilayer including the above material. For example, the node connection line 166 may have a 3-layer structure of a titanium layer/aluminum layer/titanium layer.

A first organic insulating layer 211 may be located on the node connection line 166. The first organic insulating layer 211 may include an organic insulating material. The organic insulating material may include acryl, benzo cyclobutene (BCB), polyimide, or hexamethyldisiloxane (HMDSO).

The data line DL and driving voltage line PL may be located on the first organic insulating layer 211. The data line DL and driving voltage line PL may include Al, Cu, and/or Ti, and include a single layer or multilayer including the above material. For example, the data line DL and driving voltage line PL may have a three-layer structure of titanium layer/aluminum layer/titanium layer.

In FIG. 5, the data line DL and driving voltage line PL are arranged on a same layer (for example, the first organic insulating layer 211), but according to some embodiments, the data line DL and driving voltage line PL may be arranged on different layers.

A second organic insulating layer 212, a third organic insulating layer 213, and a fourth organic insulating layer 214 may be located on the first organic insulating layer 211. The second organic insulating layer 212, third organic insulating layer 213, and fourth organic insulating layer 214 may each include an organic insulating material such as acryl, BCB, polyimide, or HMDSO.

A first electrode 221 of the first light-emitting diode ED1 may be located on the fourth organic insulating layer 214. The first electrode 221 may be electrically connected to the sixth transistor T6 through a first contact metal CM1, a second contact metal CM2, a third contact metal CM3, and a fourth contact metal CM4. The first contact metal CM1 may be formed on a same layer as the node connection line 166 and include a same material as the node connection line 166. The second contact metal CM2 may be formed on a same layer as the data line DL and/or the driving voltage line PL, and include a same material as the data line DL and/or the driving voltage line PL. The third contact metal CM3 and fourth contact metal CM4 may include a conductive material, for example, a metal (for example, a non-transmissive metal) or a light-transmissive conductive material.

The first electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the first electrode 221 may further include a conductive oxide layer on and/or below the reflective layer. The conductive oxide layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some embodiments, the first electrode 221 may include a plurality of sub-layers. For example, the first electrode 221 may include a first sub-layer 221a, a second sub-layer 221b, and a third sub-layer 221c. The first sub-layer 221a, the second sub-layer 221b, and the third sub-layer 221c may respectively be an ITO layer, an Ag layer, and an ITO layer.

A bank layer 215 may be located on the first electrode 221. The bank layer 215 includes an opening overlapping the first electrode 221 and may cover an edge of the first electrode 221. The bank layer 215 may include an organic insulating material, such as polyimide.

A spacer 217 may be formed on the bank layer 215. The spacer 217 may be formed together with the bank layer 215 during a same process or formed individually from the bank layer 215 through a separate process. According to some embodiments, the spacer 217 may include an organic insulating material, such as polyimide. According to some embodiments, the bank layer 215 may include an organic insulating material including a light-shielding dye, and the spacer 217 may include an organic insulating material such as polyimide.

An intermediate layer 222 includes an emission layer 222b. The intermediate layer 222 may include a first functional layer 222a located below the emission layer 222b and/or a second functional layer 222c located on the emission layer 222b. The emission layer 222b may include a high-molecular weight organic material or low-molecular weight organic material, which emit light of a certain color (red, green, or blue). According to some embodiments, the emission layer 222b may include an inorganic material or a quantum dot.

The second functional layer 222c may include an electron transport layer (ETL) and/or an electron injection layer (EIL). The first functional layer 222a and the second functional layer 222c may include an organic material.

The emission layer 222b may be formed in the first display area DA1 to overlap the first electrode 221 through an opening of the bank layer 215. Meanwhile, organic material layers included in the intermediate layer 222, for example, the first functional layer 222a and the second functional layer 222c may entirely cover the display area DA of FIG. 3.

The intermediate layer 222 may have a single stack structure including a single emission layer, or a multi-stack structure including a plurality of emission layers. In a case of a tandem structure, a charge generation layer (CGL) may be arranged between a plurality of stacks.

A second electrode 223 may include a conductive material with a low work function. For example, the second electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 223 may further include a layer including ITO, IZO, ZnO, or $In_2O_3$, on the (semi-)transparent layer including the above material. The second electrode 223 may entirely cover the display area DA of FIG. 3.

A capping layer 225 may be located on the second electrode 223. The capping layer 225 may include an inorganic material or an organic material. The capping layer 225 may include lithium fluoride (LiF), an inorganic material, and/or an organic material. The capping layer 225 may entirely cover the display area DA.

The first light-emitting diode ED1 may be covered by the encapsulation layer 300. The encapsulation layer 300 may include at least one organic encapsulation layer and at least one inorganic encapsulation layer. According to some embodiments, the encapsulation layer 300 may include a first inorganic encapsulation layer 310 and a second inorganic encapsulation layer 330, and an organic encapsulation layer 320 arranged therebetween. The encapsulation layer 300 may be located on the capping layer 225.

The first inorganic encapsulation layer 310 and second inorganic encapsulation layer 330 may include one or more inorganic materials from among aluminum oxide, titanium oxide, tantalum oxide, hafnium oxide, zinc oxide, silicon oxide, silicon nitride, and silicon oxynitride. The first inorganic encapsulation layer 310 and second inorganic encapsulation layer 330 may be a single layer or multilayer including the above material. The organic encapsulation layer 320 may include a polymer-based material. Examples of the polymer-based material may include an acrylic resin, an epoxy resin, polyimide, and polyethylene. According to some embodiments, the organic encapsulation layer 320 may include acrylate.

Figure 6:
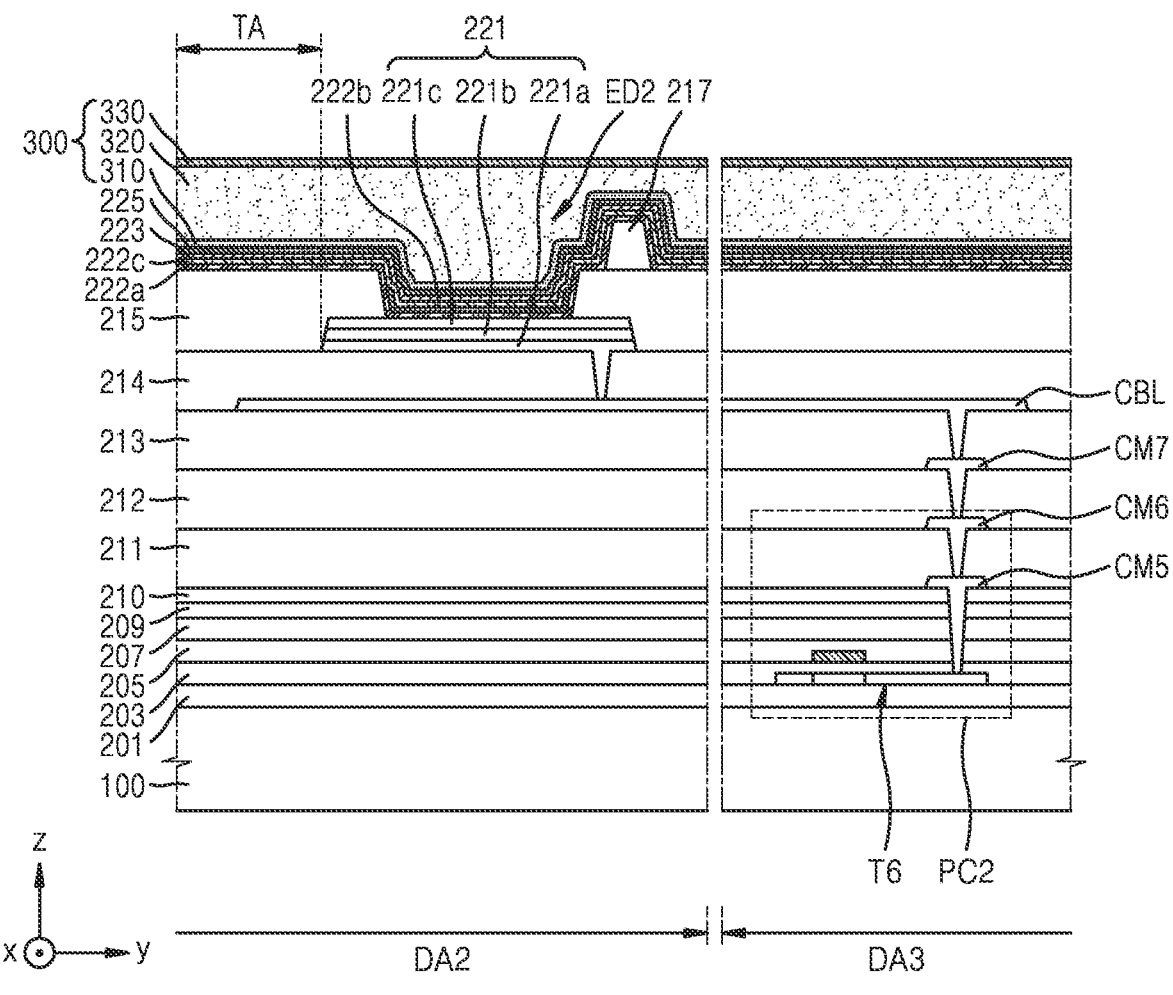
FIG. 6 is a cross-sectional view showing an electric connection between a second sub-pixel circuit and a second light-emitting diode of a display panel, according to some embodiments.

FIG. 6 is a cross-sectional view showing an electric connection between the second sub-pixel circuit PC2 and the second light-emitting diode ED2 of the display panel 10 (e.g., refer to FIG. 3), according to some embodiments.

Referring to FIG. 6, the second sub-pixel circuit PC2 on the substrate 100 may be arranged in the third display area DA3, and the second light-emitting diode ED2 electrically connected to the second sub-pixel circuit PC2 may be arranged in the second display area DA2. As described above with reference to FIG. 4, the second sub-pixel circuit PC2 may include a plurality of thin-film transistors and a storage capacitor. In this regard, FIG. 6 shows the sixth transistor T6 of the second sub-pixel circuit PC2. The buffer layer 201, the first gate insulating layer 203, the first interlayer insulating layer 205, the second interlayer insulating layer 207, the second gate insulating layer 209, the third interlayer insulating layer 210, and the first through fourth organic insulating layers 211 through 214 may be arranged on the substrate 100.

The second sub-pixel circuit PC2 may be electrically connected to the second light-emitting diode ED2 through the transparent conductive bus line CBL extending from the third display area DA3 towards the second display area DA2. For example, the transparent conductive bus line CBL may extend in the second direction (for example, the y direction). The transparent conductive bus line CBL may include a light-transmissive conductive material. The light-transmissive conductive material may include a transparent conductive oxide (TCO). The TCO may include a conductive oxide, such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO). Accordingly, deterioration of light transmittance of the transmission area TA may be reduced.

The transparent conductive bus line CBL may be electrically connected to the sixth transistor T6 of the second sub-pixel circuit PC2 through a fifth contact metal CM5, a sixth contact metal CM6, and a seventh contact metal CM7. The fifth contact metal CM5 may be formed on a same layer as the first contact metal CM1 of FIG. 5, and include a same material as the first contact metal CM1. The sixth contact metal CM6 may be formed on a same layer as the second contact metal CM2 of FIG. 5, and include a same material as the second contact metal CM2. The seventh contact metal CM7 may be formed on a same layer as the third contact metal CM3 of FIG. 5, and include a same material as the third contact metal CM3.

The transparent conductive bus line CBL may be electrically connected to the first electrode 221 of the second light-emitting diode ED2 located in the second display area DA2. According to some embodiments, in FIG. 6, the first electrode 221 of the second light-emitting diode ED2 is electrically connected to the transparent conductive bus line CBL through a contact hole of the fourth organic insulating layer 214, but the disclosure is not limited thereto. According to some embodiments, the electric connection between the transparent conductive bus line CBL and the first electrode 221 of the second light-emitting diode ED2 may be achieved through a connection line connecting the first electrodes 221 of the neighboring second light-emitting diodes ED2. The various embodiments described above will be described below in detail by referring to FIGS. 10, 12, and 14.

The spacer 217 and the bank layer 215 including an opening overlapping the first electrode 221 may be located on the first electrode 221 of the second light-emitting diode ED2. Also, as described above with reference to FIG. 5, the first functional layer 222*a*, emission layer 222*b*, second functional layer 222*c*, second electrode 223, capping layer 225, and encapsulation layer 300 may be arranged on the first electrode 221. As described above with reference to FIG. 5, the first electrode 221 may include the first sub-layer 221*a* including ITO, the second sub-layer 221*b* including Ag, and the third sub-layer 221*c* including ITO.

Figure 7:
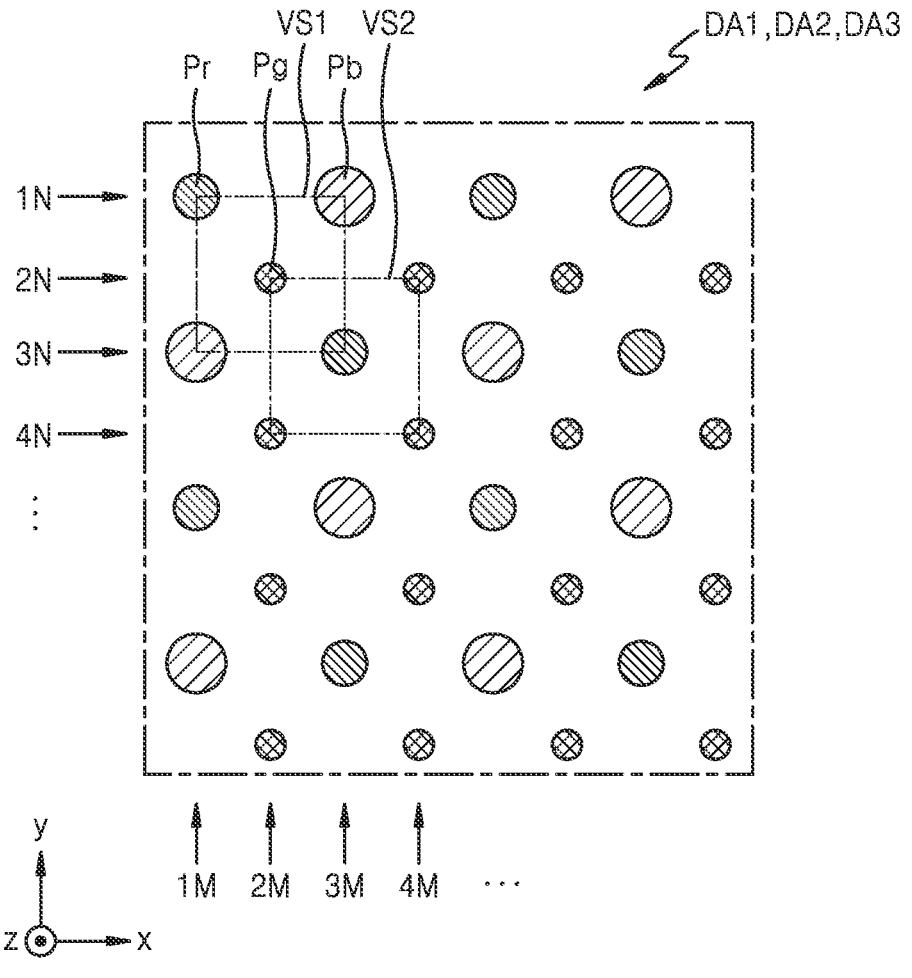
FIG. 7 is a plan view of sub-pixels arranged in a display area of a display panel, according to some embodiments.

FIG. 7 is a plan view of sub-pixels arranged in the display area DA (e.g., refer to FIG. 3) of the display panel 10 (e.g., refer to FIG. 3), according to some embodiments. Referring to FIG. 7, a red sub-pixel Pr, a green sub-pixel Pg, and a blue sub-pixel Pb arranged in each of the first through third display areas DA1 through DA3 may have a same arrangement in a plan view.

According to some embodiments, the first through third display areas DA1 through DA3 may have a same resolution. In other words, the number and/or area of light-emitting diodes arranged in the first display area DA1, the number and/or area of light-emitting diodes arranged in the second display area DA2, and the number and/or area of light-emitting diodes arranged in the third display area DA3 may be the same per same area.

For example, referring to FIG. 7, the red sub-pixel Pr, green sub-pixel Pg, and blue sub-pixel Pb may be arranged in a diamond PenTile™ type. In FIG. 5, 1N, 2N, 3N, 4N, and so on indicate rows of sub-pixels and 1M, 2M, 3M, 4M, and so on indicate columns of sub-pixels.

For example, the plurality of red sub-pixels Pr and the plurality of blue sub-pixels Pb are alternately arranged in the first row 1N, the plurality of green sub-pixels Pg are arranged in the adjacent second row 2N at certain intervals, the plurality of blue sub-pixels Pb and the plurality of red sub-pixels Pr are alternately arranged in the adjacent third row 3N, and the plurality of green sub-pixels Pg are arranged in the adjacent fourth row 4N at certain intervals. Such arrangements of sub-pixels are repeated. According to some embodiments, the sizes (or widths) of the blue sub-pixel Pb and red sub-pixel Pr may be greater than the size (or width) of the green sub-pixel Pg. The size (or width) of the blue sub-pixel Pb and the size (or width) of the red sub-pixel Pr may be the same or different from each other.

The pluralities of red sub-pixels Pr and blue sub-pixels Pb arranged in the first row 1N, and the plurality of green sub-pixels Pg arranged in the second row 2N are misaligned. Accordingly, the red sub-pixel Pr and the blue sub-pixel Pb are alternately arranged in the first column 1M, the plurality of green sub-pixels Pg are arranged in the adjacent second column 2M at certain intervals, the blue sub-pixel Pb and the red sub-pixel Pr are alternately arranged in the adjacent third column 3M, and the plurality of green sub-pixels Pg are arranged in the adjacent fourth column 4M at certain intervals. Such arrangements of sub-pixels are repeated.

Such a sub-pixel arrangement structure may be differently expressed that the red sub-pixel Pr is arranged at a first vertex and a third vertex located in a diagonal direction from among vertexes of a first virtual quadrangle VS1 using a center point of the green sub-pixel Pg as a center point of a quadrangle, and the blue sub-pixel Pb is arranged at a second vertex and a fourth vertex that are remaining vertexes.

Also, such a sub-pixel arrangement structure may be differently expressed that the green sub-pixel Pg is arranged at each vertex of a second virtual quadrangle VS2 using a center point of the red sub-pixel Pr or blue sub-pixel Pb as a center point of a quadrangle. Here, the first and second virtual quadrangles VS1 and VS2 may be variously modified to a rectangle, a rhombus, or a square.

Such a sub-pixel arrangement structure is referred to as a diamond PenTile™ type, and high resolution may be realized with a smaller number of sub-pixels by applying rendering of representing colors by sharing adjacent sub-pixels.

Figure 8:
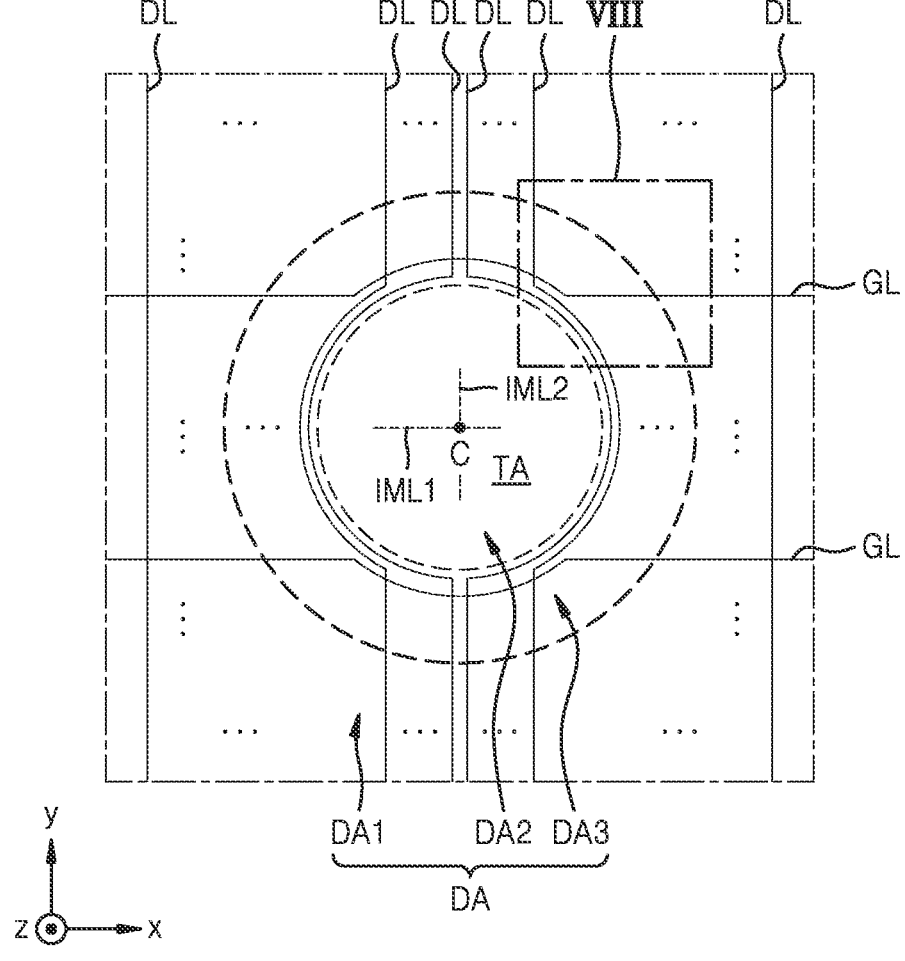
FIG. 8 is a plan view of a portion of a display panel, according to some embodiments.

FIG. 8 is a plan view of a portion of the display panel 10 (e.g., refer to FIG. 3), according to some embodiments. For convenience of descriptions, FIG. 8 illustrates signal lines passing through the display area DA, for example, the data line DL and a gate line GL.

Referring to FIG. 8, the gate lines GL may extend in the first direction (for example, the x direction) in overall. The gate lines GL may be bent or curved from the third display area DA3 along an outer side of the second display area DA2. For example, one of the gate lines GL may be bent or curved from the third display area DA3 along an upper side of the second display area DA2, and the other one of the gate lines GL may be bent or curved from the third display area DA3 along a lower side of the second display area DA2. For example, one gate line GL curved along the upper side of the second display area DA2 and the other gate line GL curved along the lower side of the second display area DA2 may be symmetrical based on a first virtual line IML1 passing through a center C of the second display area DA2.

The gate line GL of FIG. 8 may be the scan line SL and/or the emission control line EL connected to the sub-pixel circuit PC of FIG. 4 described with reference to FIG. 4. For example, the gate line GL may include the first scan line SL1 of FIG. 4, the second scan line SL2 of FIG. 4, the previous scan line SLp of FIG. 4, the next scan line SLn of FIG. 4, and/or the emission control line EL of FIG. 4. In other words, the first scan line SL1 of FIG. 4, the second scan line SL2 of FIG. 4, the previous scan line SLp of FIG. 4, the next scan line SLn of FIG. 4, and/or the emission control line EL of FIG. 4, which are electrically connected to sub-pixel circuits arranged in the third display area DA3 may be bent or curved in the third display area DA3 to partially surround the second display area DA2.

Some data lines DL may entirely extend in the second direction (for example, the y direction). Some data lines DL may be bent or curved from the third display area DA3 along the outer side of the second display area DA2. For example, one of the data lines DL may be bent or curved from the third display area DA3 along a left side of the second display area DA2, and the other one of the data lines DL may be bent or curved from the third display area DA3 along a right side of the second display area DA2. The one data line DL curved along the left side of the second display area DA2 and the other data line DL curved along the right side of the second display area DA2 may be symmetrical based on a second virtual line IML2.

As described above, each of the data line DL and the gate line GL does not pass through the second display area DA2 and thus the transmission area TA may be sufficiently secured.

Figure 9A:
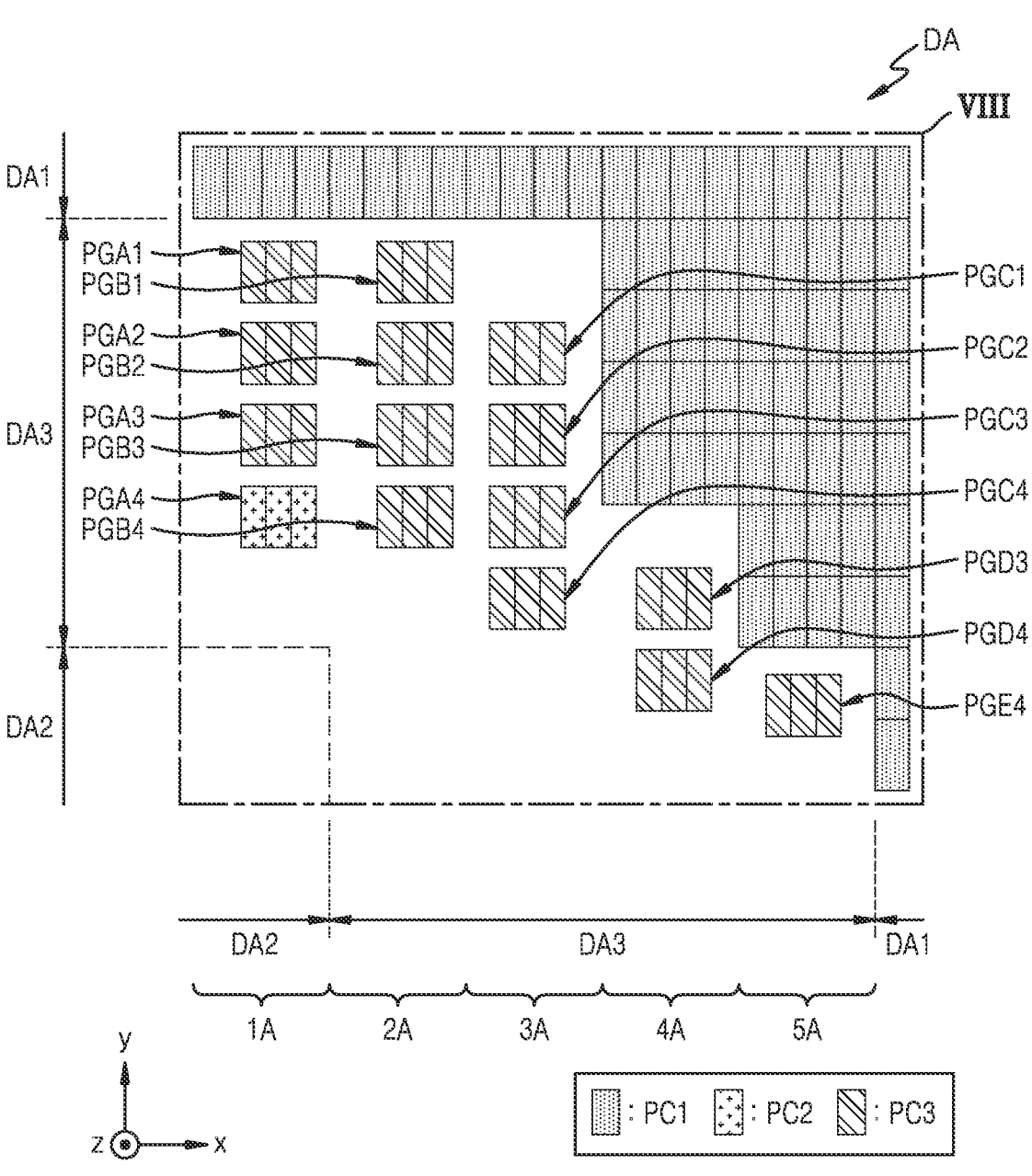
FIG. 9A is a plan view showing a portion VIII of the display panel of FIG. 8, according to some embodiments.
Figure 9B:
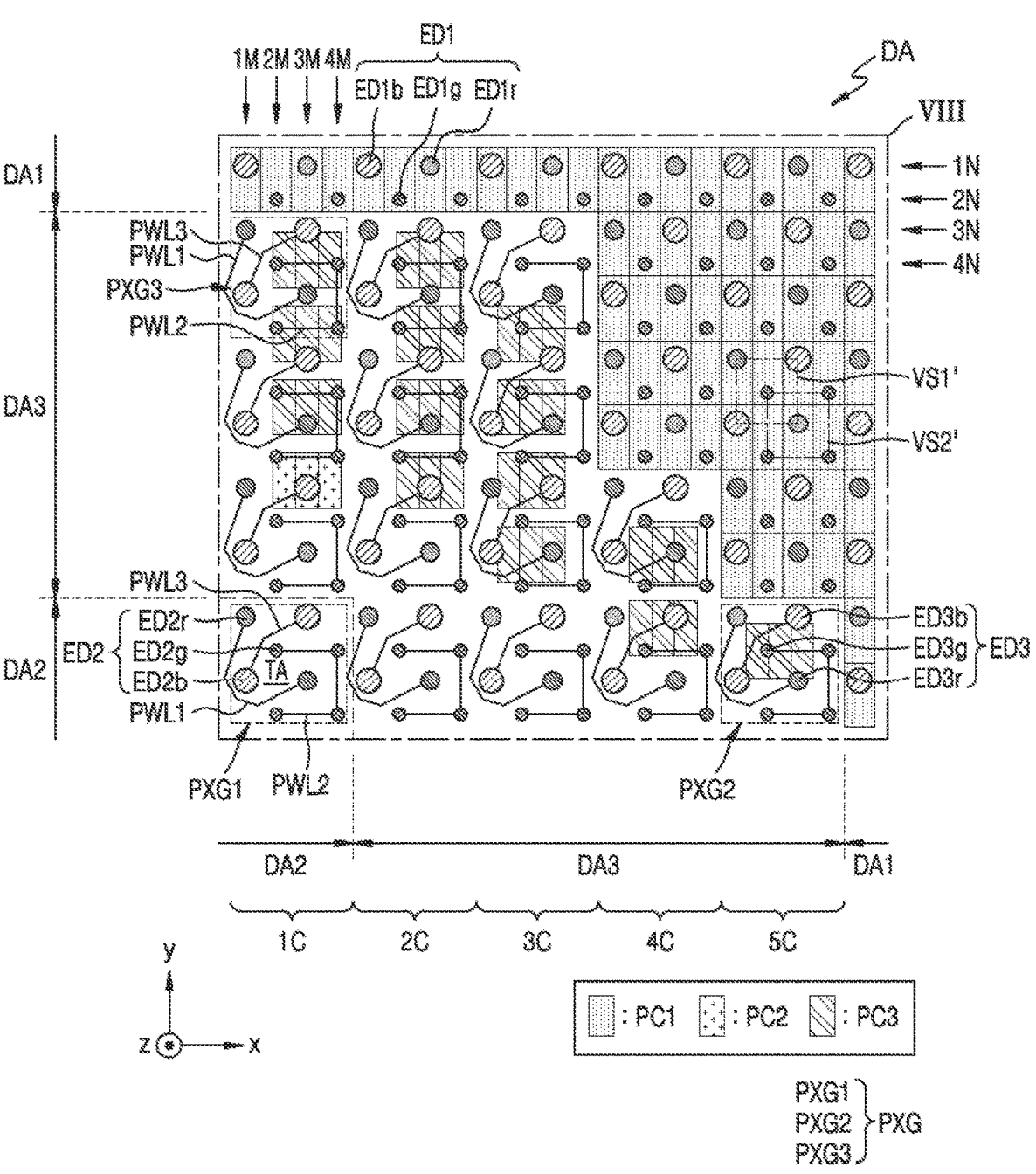
FIG. 9B is a plan view showing a portion VIII of the display panel of FIG. 8, according to some embodiments.

FIGS. 9A and 9B are each a plan view showing a portion VIII that is a portion of the display panel 10 of FIG. 8, according to some embodiments. For convenience of descriptions, FIG. 9A illustrates sub-pixel circuits and FIG. 9B illustrates light-emitting diodes electrically connected to the sub-pixel circuits of FIG. 9A.

Referring to FIG. 9A, the sub-pixel circuits are arranged in the first display area DA1 and third display area DA3 of the display area DA, but are not arranged in the second display area DA2.

The sub-pixel circuits arranged in the first display area DA1, for example, the first sub-pixel circuits PC1, may be arranged to form rows and columns. The first sub-pixel circuits PC1 may be arranged at regular intervals in the first direction (for example, the x direction) and the second direction (for example, the y direction). According to some embodiments, the first sub-pixel circuits PC1 adjacent to the third display area DA3 may be arranged to have a stepwise configuration in a plan view.

The sub-pixel circuits arranged in the third display area DA3 may also be arranged to form rows and columns. The sub-pixel circuits arranged in the third display area DA3, for example, the second sub-pixel circuits PC2 and the third sub-pixel circuits PC3, may be arranged to form rows and columns in the third display area DA3. The second sub-pixel circuits PC2 and the third sub-pixel circuits PC3 may form rows and columns different from those of the first sub-pixel circuits PC1 arranged in the first display area DA1. For example, three second sub-pixel circuits PC2 may form one sub-pixel circuit group, and three third sub-pixel circuits PC3 may form one sub-pixel circuit group.

Sub-pixel circuit groups may be spaced apart from each other in the first direction (for example, the x direction) and/or the second direction (for example, the y direction) in the third display area DA3. In this regard, FIG. 9A illustrates sub-pixel circuit groups PGA1 through PGA4 arranged in a first column 1A in the second direction (for example, the y direction), sub-pixel circuit groups PGB1 through PGB4 arranged in a second column 2A, sub-pixel circuit groups PGC1 through PGC4 arranged in a third column 3A, sub-pixel circuit groups PGD3 and PGD4 arranged in a fourth column 4A, and a sub-pixel circuit group PGE4 arranged in a fifth column 5A.

The sub-pixel circuit groups arranged in the third display area DA3 may be spaced apart from each other in the first direction (for example, the x direction, a row direction of the sub-pixel circuit groups). The sub-pixel circuit groups arranged in the third display area DA3 may be spaced apart from each other in the second direction (for example, the y direction, a column direction of the sub-pixel circuit groups). For example, in FIG. 9A, the sub-pixel circuit groups arranged in a same column are spaced apart from each other in the second direction (for example, the y direction, the column direction of the sub-pixel circuit groups), but the disclosure is not limited thereto. According to some embodiments, the sub-pixel circuit groups arranged in the same column may not be spaced apart from each other in the second direction (for example, the y direction, the column direction of the sub-pixel circuit groups).

The sub-pixel circuits arranged in the first and third display areas DA1 and DA3 may drive the light-emitting diodes arranged in the first through third display areas DA1 through DA3.

Referring to FIG. 9B, the light-emitting diodes may include the first light-emitting diodes ED1 arranged in the first display area DA1, the second light-emitting diodes ED2 arranged in the second display area DA2, and the third light-emitting diodes ED3 arranged in the third display area DA3.

The first light-emitting diodes ED1 may include a first red light-emitting diode ED1r, a first green light-emitting diode ED1g, and a first blue light-emitting diode ED1b. The second light-emitting diodes ED2 may include a second red light-emitting diode ED2r, a second green light-emitting diode ED2g, and a second blue light-emitting diode ED2b. The third light-emitting diodes ED3 may include a third red light-emitting diode ED3r, a third green light-emitting diode ED3g, and a third blue light-emitting diode ED3b.

Arrangements of red, green, and blue light-emitting diodes in the display area DA may be substantially the same as the arrangements of the red, green, and blue sub-pixels Pr, Pg and Pb described above with reference to FIG. 7. As shown in FIG. 9B, an arrangement of the first light-emitting diodes ED1 in the first display area DA1, an arrangement of the second light-emitting diodes ED2 in the second display area DA2, and an arrangement of the third light-emitting diodes ED3 in the third display area DA3 may be the same. Accordingly, resolutions of the first through third display areas DA1 through DA3 may be the same.

In the display area DA, red light-emitting diodes and blue light-emitting diodes are alternately arranged in the first row 1N, a plurality of green light-emitting diodes are spaced apart from each other in the adjacent second row 2N at certain intervals, the blue light-emitting diodes and the red light-emitting diodes are alternately arranged in the adjacent third row 3N, and the green light-emitting diodes are spaced apart from each other in the adjacent fourth row 4N at certain intervals.

The red light-emitting diode and the blue light-emitting diodes arranged in the first row 1N, and the plurality of green light-emitting diodes arranged in the second row 2N may be misaligned. Accordingly, in the display area DA, the red light-emitting diodes and the blue light-emitting diodes are alternately arranged in the first column 1M, the plurality of green light-emitting diodes are spaced apart from each other in the adjacent second column 2M at certain intervals, the blue light-emitting diodes and the red light-emitting diodes are alternately arranged in the adjacent third column 3M, and the plurality of green light-emitting diodes are spaced apart from each other in the adjacent fourth column 4M at certain intervals. Such arrangements of sub-pixels (or light-emitting diodes) may be repeated.

The arrangements of light-emitting diodes may be differently expressed as below. For example, the first red light-emitting diode ED1r may be arranged at a first vertex and a third vertex located in a diagonal direction from among vertexes of a first virtual quadrangle VS1' using a center point of the first green light-emitting diode ED1g arranged in the first display area DA1 as a center point of a quadrangle, and the first blue light-emitting diode ED1b may be arranged at a second vertex and a fourth vertex that are remaining vertexes. An arrangement structure of the first light-emitting diodes ED1 may be differently expressed that the first green light-emitting diode ED1g is arranged at each of four vertexes of a second virtual quadrangle VS2' using a center point of the first red light-emitting diode ED1r or first blue light-emitting diode ED1b as a center point of a quadrangle.

Arrangements of the second red light-emitting diode ED2r, second green light-emitting diode ED2g, and second blue light-emitting diode ED2b in the second display area DA2 may be the same as the arrangements of the first red light-emitting diode ED1r, first green light-emitting diode ED1g, and first blue light-emitting diode ED1b described above. For example, the second red light-emitting diode ED2r may be arranged at each of vertexes in a first diagonal direction from among vertexes of a first virtual quadrangle using a center point of the second green light-emitting diode ED2g as a center point of a quadrangle, and the second blue light-emitting diode ED2b may be arranged at each of vertexes in a second diagonal direction. Also, the second green light-emitting diode ED2g may be arranged at each of four vertexes of a second virtual quadrangle using a center point of the second red light-emitting diode ED2r or second blue light-emitting diode ED2b as a center point of a quadrangle.

Arrangements of the third red light-emitting diode ED3r, third green light-emitting diode ED3g, and third blue light-emitting diode ED3b in the third display area DA3 may be the same as the arrangements of the first red light-emitting diode ED1r, first green light-emitting diode ED1g, and first blue light-emitting diode ED1b described above. For example, the third red light-emitting diode ED3r may be arranged at each of vertexes in a first diagonal direction from among vertexes of a first virtual quadrangle using a center point of the third green light-emitting diode ED3g as a center point of a quadrangle, and the third blue light-emitting diode ED3b may be arranged at each of vertexes in a second diagonal direction. Also, the third green light-emitting diode ED3g may be arranged at each of four vertexes of a second virtual quadrangle using a center point of the third red light-emitting diode ED3r or third blue light-emitting diode ED3b as a center point of a quadrangle.

The first light-emitting diode ED1 of the first display area DA1 may be electrically connected to the first sub-pixel circuit PC1 of the first display area DA1. For example, one first light-emitting diode ED1 may correspond to one first sub-pixel circuit PC1 (one-to-one correspondence). The first red light-emitting diode ED1r may be electrically connected to the corresponding first sub-pixel circuit PC1, the first green light-emitting diode ED1g may be electrically connected to the corresponding first sub-pixel circuit PC1, and the first blue light-emitting diode ED1b may be electrically connected to the corresponding first sub-pixel circuit PC1.

The second light-emitting diode ED2 and the third light-emitting diode ED3 arranged in the second display area DA2 and the third display area DA3, respectively, may be electrically connected to sub-pixel circuits arranged in the third display area DA3. In FIG. 9B, for convenience of descriptions, light-emitting diodes (for example, the light-emitting diodes arranged in the second display area DA2 and third display area DA3) electrically connected to each sub-pixel circuit group of the third display area DA3 will be referred to as a light-emitting diode group PXG. Each light-emitting diode group PXG may include two red light-emitting diodes, two blue light-emitting diodes, and four green light-emitting diodes. For example, each light-emitting diode group PXG arranged in the second display area DA2 may include two second red light-emitting diodes ED2r, four second green light-emitting diodes ED2g, and two second blue light-emitting diodes ED2b. Each light-emitting diode group PXG (e.g., a light-emitting diode group PXG3) arranged in the third display area DA3 may include two third red light-emitting diodes ED3r, four third green light-emitting diodes ED3g, and two third blue light-emitting diodes ED3b. In FIG. 9B, 1C through 5C indicate columns of the light-emitting diode groups PXG.

The light-emitting diode groups PXG arranged in a same column may be electrically connected to sub-pixel circuit groups arranged in a same column, respectively.

For example, the light-emitting diode groups PXG of the first column 1C may be respectively electrically connected to the sub-pixel circuit groups PGA1 through PGA4 of the first column 1A described above with reference to FIG. 9A. Among the light-emitting diode groups PXG of the first column 1C, some light-emitting diode groups PXG arranged in the third display area DA3 may be respectively electrically connected to some sub-pixel circuit groups PGA1 through PGA3 described above with reference to FIG. 9A. Among the light-emitting diode groups PXG of the first column 1C, the light-emitting diode groups PXG arranged in the second display area DA2 may be electrically connected to the sub-pixel circuit group PGA4 arranged in the first column 1A described above with reference to FIG. 9A. Among the light-emitting diode groups PXG of the first column 1C, the light-emitting diode groups PXG arranged in the second display area DA2 and the sub-pixel circuit group PGA4 arranged in the first column 1A may be electrically connected to each other by a transparent conductive bus line CBL described above with reference to FIGS. 3 and 6.

The light-emitting diode groups PXG of the second column 2C may be respectively electrically connected to the sub-pixel circuit groups PGB1 through PGB4 of the second column 2A described above with reference to FIG. 9A. The light-emitting diode groups PXG of the third column 3C may be respectively electrically connected to the sub-pixel circuit groups PGC1 through PGC4 of the third column 3A described above with reference to FIG. 9A. The light-emitting diode groups PXG of the fourth column 4C may be respectively electrically connected to the sub-pixel circuit groups PGD3 and PGD4 of the fourth column 4A described above with reference to FIG. 9A. The light-emitting diode group PXG (e.g., a light-emitting diode group PXG2) of the fifth column 5C may be electrically connected to the sub-pixel circuit group PGE4 of the fifth column 5A described above with reference to FIG. 9A.

Referring to FIGS. 9A and 9B, each sub-pixel circuit group arranged in the third display area DA3 includes three sub-pixel circuits, and the three sub-pixel circuits may each be electrically connected to a plurality of second or third light-emitting diodes (one-to-many correspondence). For example, one of the three sub-pixel circuits of each sub-pixel circuit group shown in FIG. 9A may be electrically connected to two red light-emitting diodes connected to each other by a first connection line PWL1 (one-to-two correspondence), another sub-pixel circuit may be electrically connected to four green light-emitting diodes connected to each other by a second connection line PWL2 (one-to-four correspondence), and the remaining sub-pixel circuit may be electrically connected to two blue light-emitting diodes connected to each other by a third connection line PWL3 (one-to-two correspondence).

For example, one sub-pixel circuit group PGA1, PGA2, or PGA3 arranged in the first column 1A in the third display area DA3 includes three third sub-pixel circuits PC3. One of the three third sub-pixel circuits PC3 may be electrically connected to one of the two third red light-emitting diodes ED3r, and the one third red light-emitting diode ED3r may be electrically connected to the other third red light-emitting diode ED3r through the first connection line PWL1 including a light-transmissive conductive material. As such, two third red light-emitting diodes ED3r electrically connected to each other through the first connection line PWL1 may be electrically connected to one third sub-pixel circuit PC3. Similarly, the other third sub-pixel circuit PC3 from among the three third sub-pixel circuits PC3 may be electrically connected to four third green light-emitting diodes ED3g connected to each other by the second connection line PWL2, and the remaining third sub-pixel circuit PC3 from among the three third sub-pixel circuits PC3 may be electrically connected to the two third blue light-emitting diodes ED3b connected to each other by the third connection line PWL3.

The sub-pixel circuit group PGA4 arranged in the first column 1A in the third display area DA3 and adjacent to the second display area DA2 may include three second sub-pixel circuits PC2. The second sub-pixel circuits PC2 of the sub-pixel circuit group PGA4 adjacent to the second display area DA2 may be electrically connected to the second light-emitting diodes ED2 arranged in the second display area DA2.

The three second sub-pixel circuits PC2 of the sub-pixel circuit group PGA4 arranged in the first column 1A and adjacent to the second display area DA2 may be electrically connected to the second light-emitting diodes ED2 of the light-emitting diode group PXG arranged in the first column 1C and located in the second display area DA2. For example, among the three second sub-pixel circuits PC2 of the sub-pixel circuit group PGA4, one second sub-pixel circuit PC2 may be electrically connected to two second red light-emitting diodes ED2r included in a light-emitting diode group PXG1 of the second display area DA2, another second sub-pixel circuit PC2 may be electrically connected to four second green light-emitting diodes ED2g through a second transparent conductive bus line CBL2 (refer to FIG. 10), and the remaining second sub-pixel circuit PC2 may be electrically connected to two second blue light-emitting diodes ED2b.

Figure 10:
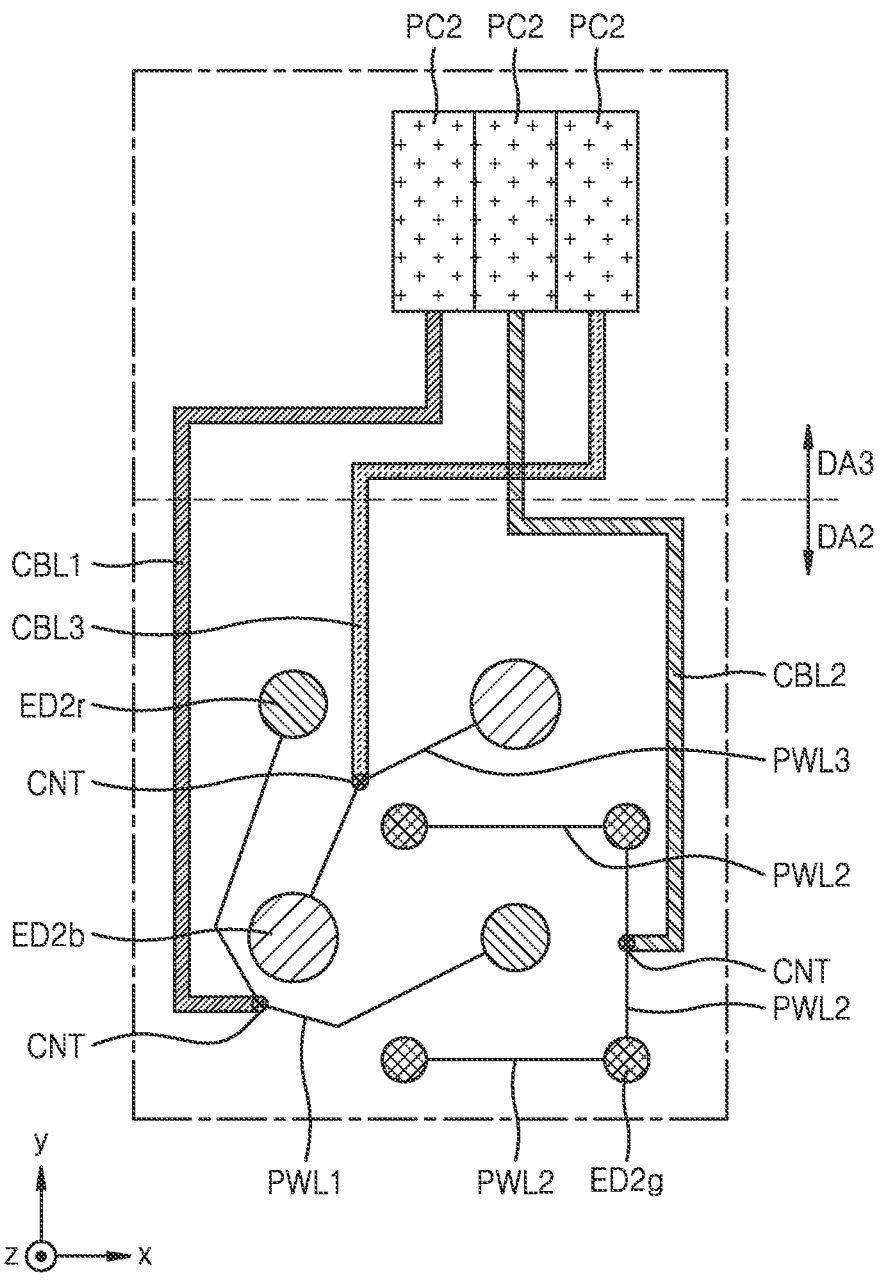
FIG. 10 is a plan view showing second sub-pixel circuits and second light-emitting diodes of a display panel being electrically connected to each other through transparent conductive bus lines, according to some embodiments.

FIG. 10 is a plan view showing second sub-pixel circuits PC2 and second light-emitting diodes of a display panel being electrically connected to each other through transparent conductive bus lines, according to some embodiments.

Each of the second sub-pixel circuits PC2 arranged in the third display area DA3 may be electrically connected to k second light-emitting diodes emitting light of a same color, wherein k is an even number. In this regard, in FIG. 10, one second sub-pixel circuit PC2 is electrically connected to two second red light-emitting diodes ED2r through a first transparent conductive bus line CBL1, another second sub-pixel circuit PC2 is electrically connected to four second green light-emitting diodes ED2g through the second transparent conductive bus line CBL2, and another second sub-pixel circuit PC2 is electrically connected to two second blue light-emitting diodes ED2b through a third transparent conductive bus line CBL3.

First electrodes of the k second light-emitting diodes emitting light of a same color may be electrically connected to each other. The k second light-emitting diodes are arranged clockwise (or counterclockwise), wherein a first electrode of an $i^{th}$ second light-emitting diode clockwise may be electrically connected to a first electrode of an $(i+1)^{th}$ second light-emitting diode through a connection line, wherein i is a natural number less than k and greater than 0.

For example, two second red light-emitting diodes ED2r may be electrically connected to each other through the first connection line PWL1. For example, a first electrode (for example, an anode) of one second red light-emitting diode ED2r may be electrically connected to a first electrode (for example, an anode) of another second red light-emitting diode ED2r through the first connection line PWL1.

other through the second connection line PWL2. A first electrode (for example, an anode) of one second green light-emitting diode ED2g may be electrically connected to a first electrode (for example, an anode) of another second green light-emitting diode ED2g through the second connection line PWL2. For example, a first electrode (for example, an anode) of a first second green light-emitting diode ED2g may be electrically connected to a first electrode (for example, an anode) of a second second green light-emitting diode ED2g through the second connection line PWL2. The first electrode (for example, an anode) of the second second green light-emitting diode ED2*g* may be electrically connected to a first electrode (for example, an anode) of a third second green light-emitting diode ED2*g* through the second connection line PWL2. The first electrode (for example, an anode) of the third second green light-emitting diode ED2*g* may be electrically connected to a first electrode (for example, an anode) of a fourth second green light-emitting diode ED2*g* through the second connection line PWL2.

Two second blue light-emitting diodes ED2*b* may be electrically connected to each other through the third connection line PWL3. For example, a first electrode (for example, an anode) of one second blue light-emitting diode ED2*b* may be electrically connected to a first electrode (for example, an anode) of another second blue light-emitting diode ED2*b* through the third connection line PWL3.

The transparent conductive bus line may extend from the third display area DA3 towards the second display area DA2. The transparent conductive bus line may electrically connect the second sub-pixel circuit PC2 of the third display area DA3 to the second light-emitting diodes arranged in the second display area DA2 and emitting light of a same color. A first portion of the transparent conductive bus line may be electrically connected to the second sub-pixel circuit PC2, and a second portion of the transparent conductive bus line may be electrically connected to a connection line connecting a first electrode of a (k/2)$^{th}$ second light-emitting diode and a first electrode of a (k/2+1)$^{th}$ second light-emitting diode to each other from among the k second light-emitting diodes emitting light of a same color. The width of the connection line may be smaller than the width of the transparent conductive bus line.

For example, the first transparent conductive bus line CBL1 may extend from the third display area DA3 towards the second display area DA2. A first portion of the first transparent conductive bus line CBL1 located in the third display area DA3 may be electrically connected to the second sub-pixel circuit PC2, and a second portion of the first transparent conductive bus line CBL1 located in the second display area DA2 may be electrically connected to the first connection line PWL1 connecting first electrodes of two second red light-emitting diodes ED2*r* to each other. The width of the first connection line PWL1 may be smaller than the width of the first transparent conductive bus line CBL1.

At least one insulating layer may be arranged between the second portion of the first transparent conductive bus line CBL1 and the first connection line PWL1. The second portion of the first transparent conductive bus line CBL1 and the first connection line PWL1 may be electrically connected to each other through a contact hole CNT formed in the at least one insulating layer.

A connecting point between the second portion of the first transparent conductive bus line CBL1 and the first connection line PWL1 may be a point where an overall length of the first connection line PWL1 is about ½. In other words, a first length of the first connection line PWL1 corresponding to a distance from the connecting point between the second portion of the first transparent conductive bus line CBL1 and the first connection line PWL1 to the first electrode of the first second red light-emitting diode ED2*r* may be substantially the same as a second length of the first connection line PWL1 corresponding to a distance from the connecting point to the first electrode of the second second red light-emitting diode ED2*r*. The first length and the second length of the first connection line PWL1 being substantially the same may indicate that a deviation of the first and second lengths is within about 10%.

The second transparent conductive bus line CBL2 may extend from the third display area DA3 towards the second display area DA2. A first portion of the second transparent conductive bus line CBL2 located in the third display area DA3 may be electrically connected to the second sub-pixel circuit PC2, and a second portion of the second transparent conductive bus line CBL2 located in the second display area DA2 may be electrically connected to the second connection line PWL2 connecting a first electrode of the second second green light-emitting diode ED2*g* and a first electrode of the third second green light-emitting diode ED2*g* to each other. The width of the second connection line PWL2 may be smaller than the width of the second transparent conductive bus line CBL2.

At least one insulating layer may be arranged between the second portion of the second transparent conductive bus line CBL2 and the second connection line PWL2. The second portion of the second transparent conductive bus line CBL2 and the second connection line PWL2 may be electrically connected to each other through the contact hole CNT formed in the at least one insulating layer.

A connecting point between the second portion of the second transparent conductive bus line CBL2, and the second connection line PWL2 connecting the first electrodes of the second second green light-emitting diode ED2*g* and third second green light-emitting diode ED2*g* may be a point where an overall length of the second connection line PWL2 is about ½. In other words, a first length of the second connection line PWL2 corresponding to a distance from the connecting point between the second portion of the second transparent conductive bus line CBL2 and the second connection line PWL2 to the first electrode of the second second green light-emitting diode ED2*g* may be substantially the same as a second length of the second connection line PWL2 corresponding to a distance from the connecting point to the first electrode of the third second green light-emitting diode ED2*g*. The first length and the second length of the second connection line PWL2 being substantially the same may indicate that a deviation of the first and second lengths is within about 10%.

The third transparent conductive bus line CBL3 may extend from the third display area DA3 towards the second display area DA2. A first portion of the third transparent conductive bus line CBL3 located in the third display area DA3 may be electrically connected to the second sub-pixel circuit PC2, and a second portion of the third transparent conductive bus line CBL3 located in the second display area DA2 may be electrically connected to the third connection line PWL3 connecting a first electrode of the first second blue light-emitting diode ED2*b* and a first electrode of the second second blue light-emitting diode ED2*b* to each other. The width of the third connection line PWL3 may be smaller than the width of the third transparent conductive bus line CBL3.

At least one insulating layer may be arranged between the second portion of the third transparent conductive bus line CBL3 and the third connection line PWL3. The second portion of the third transparent conductive bus line CBL3 and the third connection line PWL3 may be electrically connected to each other through the contact hole CNT formed in the at least one insulating layer.

A connecting point between the second portion of the third transparent conductive bus line CBL3 and the third connection line PWL3 may be a point where an overall length of the third connection line PWL3 is about ½. In other words, a first length of the third connection line PWL3 corresponding to a distance from the connecting point between the second portion of the third transparent conductive bus line CBL3 and the third connection line PWL3 to the first electrode of the first second blue light-emitting diode ED2b may be substantially the same as a second length of the third connection line PWL3 corresponding to a distance from the connecting point to the first electrode of the second second blue light-emitting diode ED2b. The first length and the second length of the third connection line PWL3 being substantially the same may indicate that a deviation of the first and second lengths is within about 10%.

According to embodiments of the disclosure, a transparent conductive bus line is electrically connected to a connection line as described above, and thus a voltage drop of a voltage applied to first electrodes of second light-emitting diodes through the transparent conductive bus line may be reduced. As a comparative example of the disclosure, when a transparent conductive bus line is electrically connected to a first electrode of a first second light-emitting diode from among k second light-emitting diodes emitting light of a same color, and a first electrode of an $i^{th}$ second light-emitting diode is connected to a first electrode of an $(i+1)^{th}$ second light-emitting diode through a connection line, a voltage applied to a kth second light-emitting diode may be dropped due to self-resistance of the connection line(s). Accordingly, luminance of light emitted from the k second light-emitting diodes emitting the light of same color and connected through the connection line may vary. However, according to embodiments of the disclosure, a transparent conductive bus line is electrically connected to a connection line connecting a first electrode of a $(k/2)^{th}$ second light-emitting diode and a first electrode of a $(k/2+1)^{th}$ second light-emitting diode to each other from among k second light-emitting diodes emitting light of a same color as described above, and thus instances of a voltage drop may be prevented or reduced.

Figure 11A:
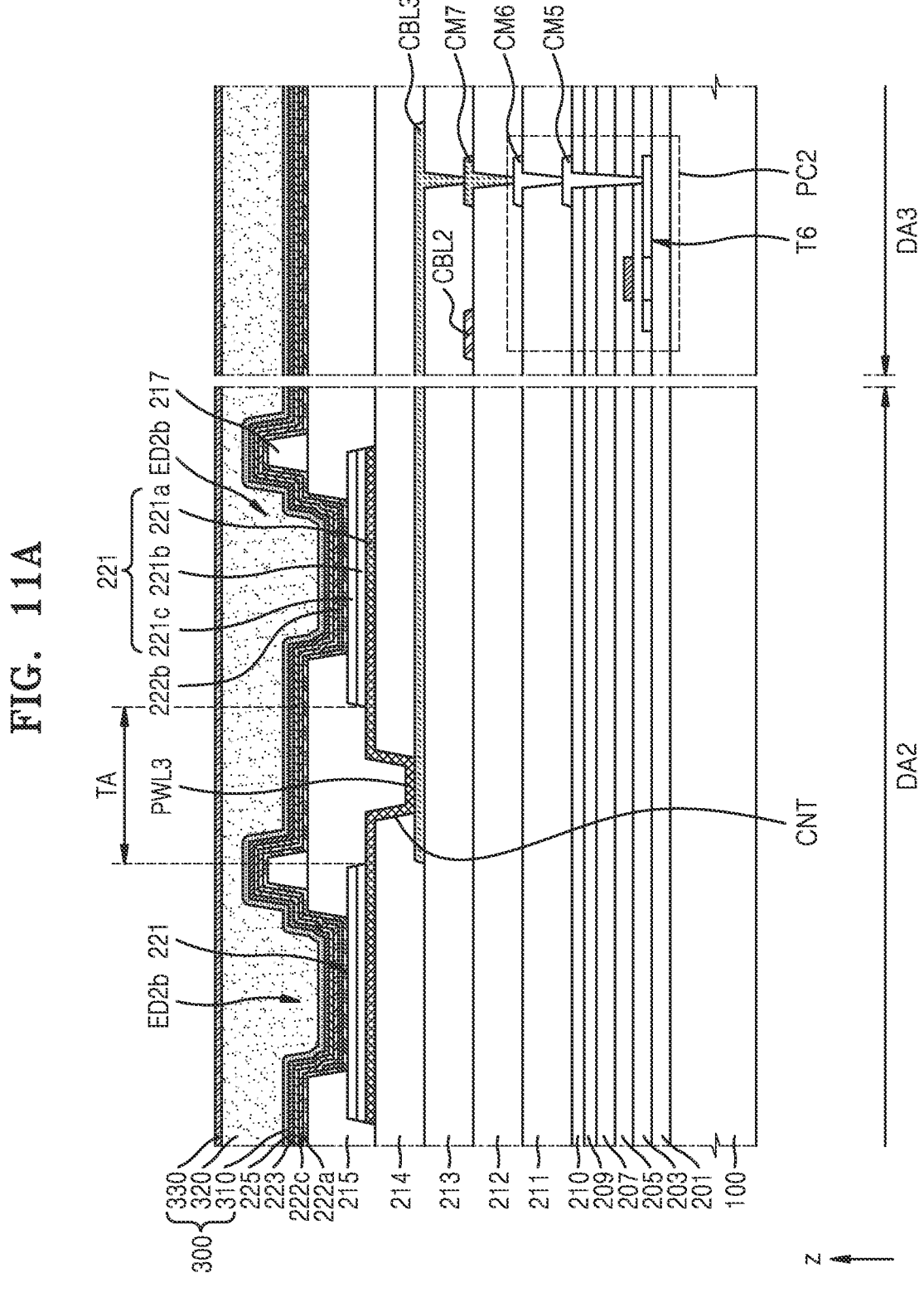
FIG. 11A is a cross-sectional view schematically showing a second display area and a third display area of a display panel, according to some embodiments.
Figure 11B:
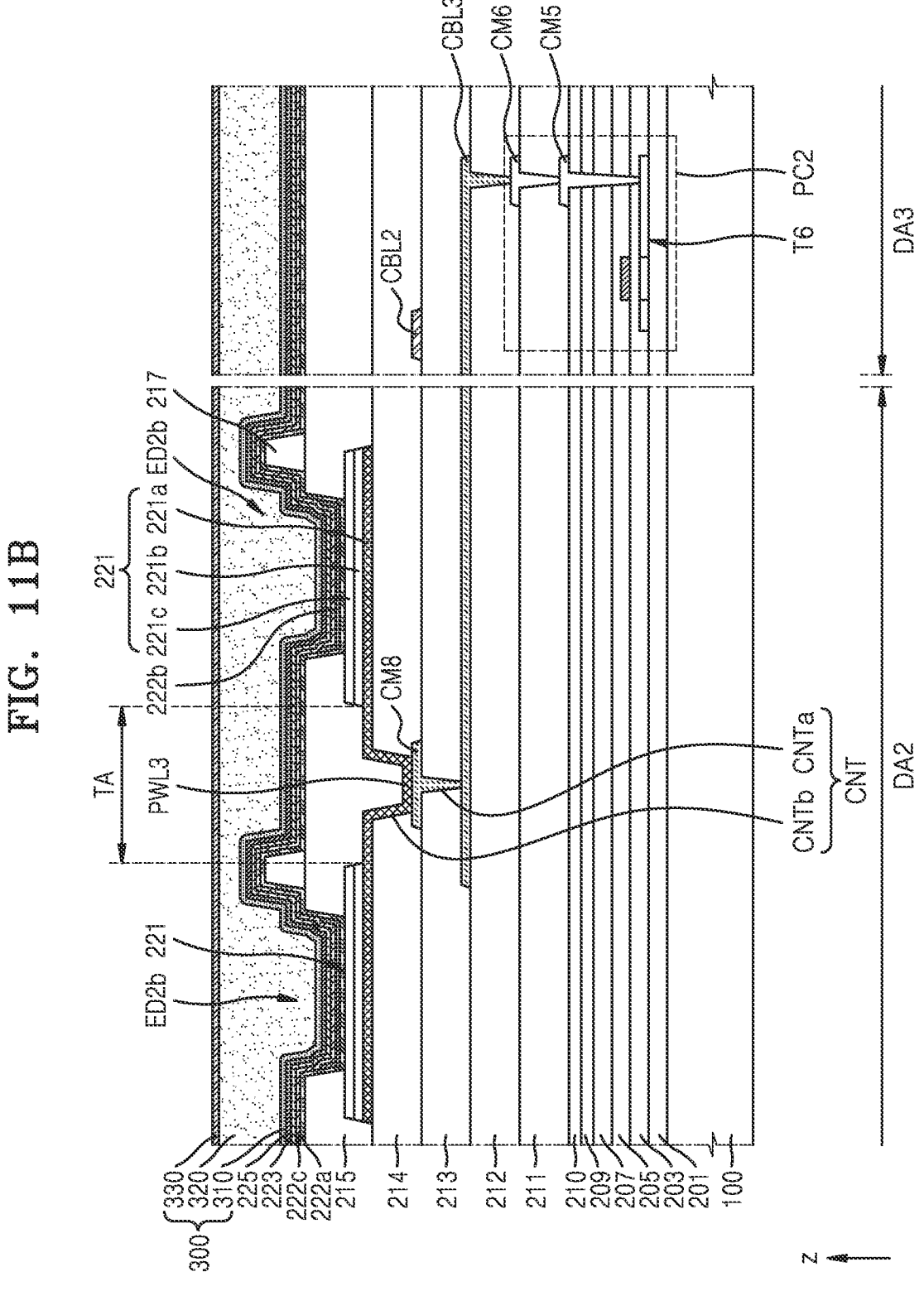
FIG. 11B is a cross-sectional view schematically showing a second display area and a third display area of a display panel, according to some embodiments.

FIGS. 11A and 11B are each a cross-sectional view schematically showing the second display area DA2 and the third display area DA3 of a display panel, according to some embodiments. For convenience of descriptions, FIGS. 11A and 11B show two second blue light-emitting diodes ED2b connected through the third connection line PWL3 from among second light-emitting diodes described with reference to FIG. 10.

The second blue light-emitting diode ED2b of FIGS. 11A and 11B may be arranged in the second display area DA2 and electrically connected to the second sub-pixel circuit PC2 arranged in the third display area DA3 through the third transparent conductive bus line CBL3. One second blue light-emitting diode ED2b may be electrically connected to the other second blue light-emitting diode ED2b emitting light of a same color, through the third connection line PWL3.

The third connection line PWL3 may be located on a same layer (for example, the fourth organic insulating layer 214) as the first electrodes 221 of the second blue light-emitting diodes ED2b connected to each other by the third connection line PWL3. The third connection line PWL3 may be integrally coupled to one sub-layer included in each of the first electrodes 221 of the second blue light-emitting diodes ED2b. According to some embodiments, as described above with reference to FIGS. 5 and 6, the first electrode 221 may include the first sub-layer 221a, the second sub-layer 221b, and the third sub-layer 221c, and the third connection line PWL3 may be integrated with the first sub-layer 221a at the bottom from among sub-layers of the first electrode 221. The third connection line PWL3 may be formed together while the first electrode 221 is formed. The first sub-layer 221a and the third connection line PWL3 may include a same material.

For example, the first sub-layer 221a and the third connection line PWL3 may include ITO. According to some embodiments, the first sub-layer 221a and the third connection line PWL3 may be crystallized during a manufacturing process of the display panel, and accordingly, the first sub-layer 221a and the third connection line PWL3 may include crystallized ITO.

Referring to FIG. 11A, at least one insulating layer, for example, the fourth organic insulating layer 214, may be arranged between the third transparent conductive bus line CBL3 and the first electrode 221 and between the third transparent conductive bus line CBL3 and the third connection line PWL3. The contact hole CNT may be formed in the fourth organic insulating layer 214. The third connection line PWL3 may be electrically connected to the third transparent conductive bus line CBL3 through the contact hole CNT of the fourth organic insulating layer 214. For example, the third connection line PWL3 may directly contact the third transparent conductive bus line CBL3 through the contact hole CNT of the fourth organic insulating layer 214.

According to some embodiments, referring to FIG. 11B, at least one insulating layer, for example, the third organic insulating layer 213 and the fourth organic insulating layer 214 may be arranged between the third transparent conductive bus line CBL3 and the first electrode 221 and between the third transparent conductive bus line CBL3 and the third connection line PWL3. The third connection line PWL3 may be electrically connected to the third transparent conductive bus line CBL3 through the contact hole CNT. The contact hole CNT may include a contact hole CNTa formed in the third organic insulating layer 213 and a contact hole CNTb formed in the fourth organic insulating layer 214.

The third connection line PWL3 may be connected to an eighth contact metal CM8 through the contact hole CNTb formed in the fourth organic insulating layer 214, and the eighth contact metal CM8 may be connected to the third transparent conductive bus line CBL3 through the contact hole CNTa formed in the third organic insulating layer 213.

At least a portion of one of the first through third transparent conductive bus lines CBL1 through CBL3 described with reference to FIG. 10 may be arranged on a different layer from at least a portion of another one of the first through third transparent conductive bus lines CBL1 through CBL3. In this regard, FIGS. 11A and 11B show that at least a portion of the second transparent conductive bus line CBL2 is arranged on a different layer from the third transparent conductive bus line CBL3. For example, as shown in FIG. 11A, a portion of the second transparent conductive bus line CBL2 may be located on the second organic insulating layer 212. According to some embodiments, as shown in FIG. 11B, a portion of the second transparent conductive bus line CBL2 may be located on the third organic insulating layer 213.

According to some embodiments, at least a portion of the second transparent conductive bus line CBL2 may cross the third transparent conductive bus line CBL3. In this regard, FIGS. 11A and 11B show that at least a portion of the second transparent conductive bus line CBL2 crosses the third transparent conductive bus line CBL3 in the third display area DA3, but the disclosure is not limited thereto. According to some embodiments, at least a portion of the second transparent conductive bus line CBL2 may cross the third transparent conductive bus line CBL3 in the second display area DA2.

In FIGS. 11A and 11B, the third connection line PWL3 and the third transparent conductive bus line CBL3 connecting two second blue light-emitting diodes ED2b are described, but the disclosure is not limited thereto. Structures of the first connection line PWL1 of FIG. 10 and the first transparent conductive bus line CBL1 of FIG. 10, which connect two second red light-emitting diodes ED2r, may be the same as the structures described with reference to FIGS. 11A and 11B. Structures of the second connection line PWL2 of FIG. 10 and the second transparent conductive bus line CBL2 of FIG. 10, which connect four second green light-emitting diodes ED2g, may be the same as the structures described with reference to FIGS. 11A and 11B.

For example, the first and second connection lines PWL1 and PWL2 of FIG. may be arranged on a same layer (for example, the fourth organic insulating layer 214) as the first electrodes 221 of the second red light-emitting diode ED2r and second green light-emitting diode ED2g.

The first electrodes 221 of the second red light-emitting diode ED2r and second green light-emitting diode ED2g have been described above with reference to FIG. 6. Each of the first and second connection lines PWL1 and PWL2 of FIG. 10 may be integrally coupled to one sub-layer of the first electrode 221. In some embodiments, each of the first and second connection lines PWL1 and PWL2 of FIG. 10 may be located on a same layer as one of the plurality of sub-layers of the first electrode 221, for example, the first sub-layer 221a of FIG. 6. The first and second connection lines PWL1 and PWL2 of FIG. 10 may include crystallized ITO.

For example, the first and/or second transparent conductive bus lines CBL1 and/or CBL2 of FIG. 10 may be located on the second organic insulating layer 212 or on the third organic insulating layer 213. The first and/or second connection lines PWL1 and/or PWL2 of FIG. 10 may each be electrically connected to the first and/or second transparent conductive bus lines CBL1 and/or CBL2 of FIG. 10 through a contact hole of the fourth organic insulating layer 214. Alternatively, the first and/or second connection lines PWL1 and/or PWL2 of FIG. 10 may respectively be electrically connected to the first and/or second transparent conductive bus lines CBL1 and/or CBL2 of FIG. 10 through contact holes of the third and fourth organic insulating layers 213 and 214.

Figure 12:
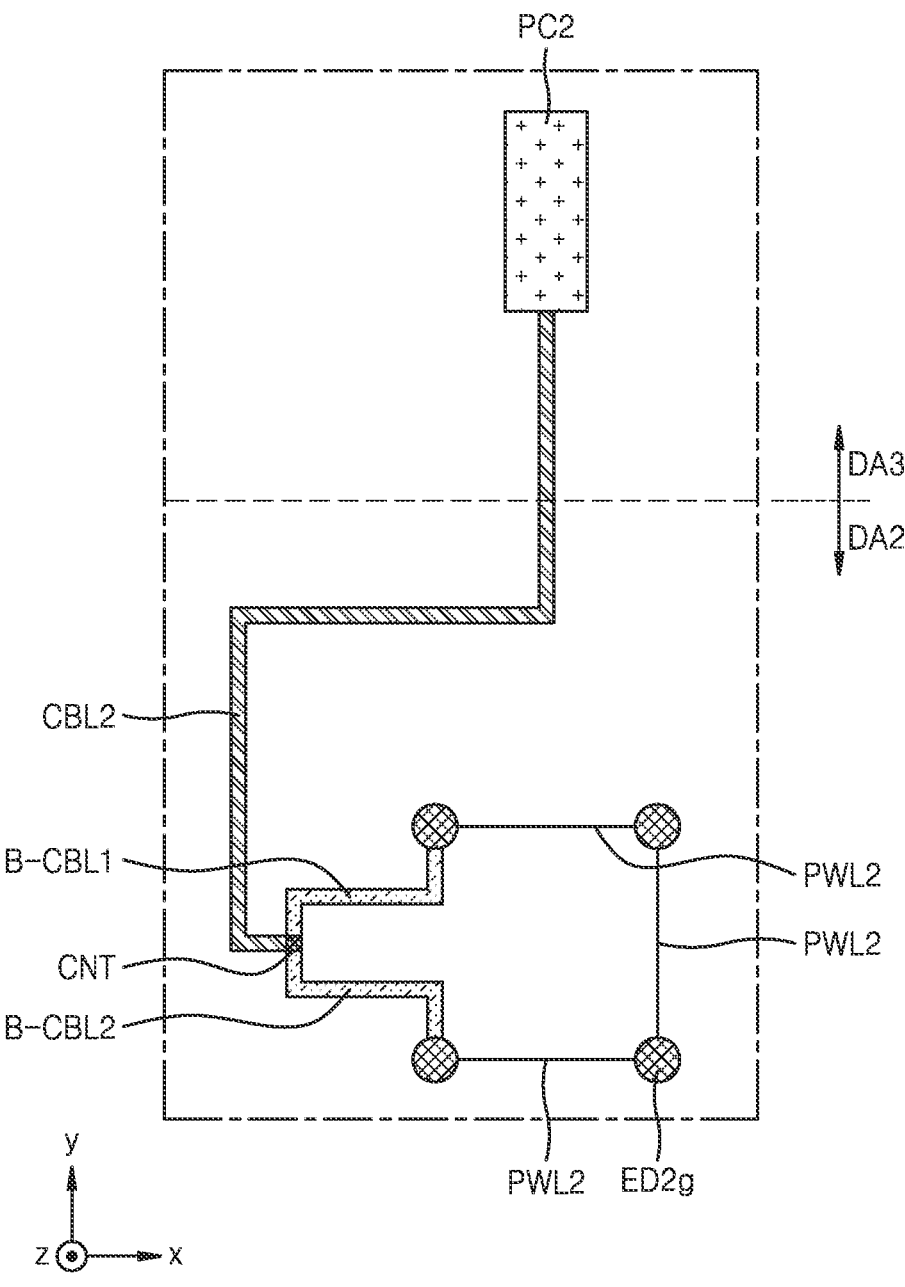
FIG. 12 is a plan view showing a second sub-pixel circuit and second light-emitting diodes of a display panel being electrically connected to each other through a transparent conductive bus line and branch conductive bus lines, according to some embodiments.

FIG. 12 is a plan view showing the second sub-pixel circuit PC2 and second light-emitting diodes of a display panel being electrically connected to each other through a transparent conductive bus line and branch conductive bus lines, according to some embodiments. For convenience of descriptions, FIG. 12 shows that the second green light-emitting diodes ED2g and the second sub-pixel circuit PC2 are electrically connected to each other by the second transparent conductive bus line CBL2, a first branch conductive bus line B-CBL1, and a second branch conductive bus line B-CBL2.

Referring to FIG. 12, a transparent conductive bus line extending from the third display area DA3 towards the second display area DA2 may be electrically connected to the first branch conductive bus line B-CBL1 and second branch conductive bus line B-CBL2. One end portion of each of the first branch conductive bus line B-CBL1 and the second branch conductive bus line B-CBL2 may be electrically connected to a connection line connecting a first electrode of a first second light-emitting diode and a first electrode of a k'$^{th}$ second light-emitting diode to each other from among k' second light-emitting diodes emitting light of a same color.

First electrodes of the k' second light-emitting diodes emitting light of a same color may be electrically connected to each other by the connection line, wherein k' is a natural number greater than 1. The k' second light-emitting diodes are arranged clockwise (or counterclockwise), wherein a first electrode of an i$^{th}$ second light-emitting diode clockwise may be electrically connected to a first electrode of an (i+1)$^{th}$ second light-emitting diode through a connection line, wherein i is a natural number less than k' and greater than 0. In this regard, FIG. 12 shows that four second green light-emitting diodes ED2g are electrically connected to each other through the second connection line PWL2. The width of the second connection line PWL2 may be smaller than the width of the second transparent conductive bus line CBL2, the width of the first branch conductive bus line B-CBL1, and/or the width of the second branch conductive bus line B-CBL2.

A first electrode (for example, an anode) of one second green light-emitting diode ED2g may be electrically connected to a first electrode (for example, an anode) of another second green light-emitting diode ED2g through the second connection line PWL2. For example, a first electrode (for example, an anode) of a first second green light-emitting diode ED2g may be electrically connected to a first electrode (for example, an anode) of a second second green light-emitting diode ED2g through the second connection line PWL2. The first electrode (for example, an anode) of the second second green light-emitting diode ED2g may be electrically connected to a first electrode (for example, an anode) of a third second green light-emitting diode ED2g through the second connection line PWL2. The first electrode (for example, an anode) of the third second green light-emitting diode ED2g may be electrically connected to a first electrode (for example, an anode) of a fourth second green light-emitting diode ED2g through the second connection line PWL2.

The second sub-pixel circuit PC2 arranged in the third display area DA3 may be electrically connected to the k' second light-emitting diodes emitting light of a same color. In this regard, FIG. 12 shows that one second sub-pixel circuit PC2 is electrically connected to four second green light-emitting diodes ED2g through the second transparent conductive bus line CBL2, first branch conductive bus line B-CBL1, and second branch conductive bus line B-CBL2.

The second transparent conductive bus line CBL2 may extend from the third display area DA3 towards the second display area DA2, wherein a first portion of the second transparent conductive bus line CBL2 may be electrically connected to the second sub-pixel circuit PC2 and a second portion of the second transparent conductive bus line CBL2 may be electrically connected to the first branch conductive bus line B-CBL1 and second branch conductive bus line B-CBL2. To increase transmittance and/or transmissive surface area of the transmission area TA of FIG. 13 of the second display area DA2, the first branch conductive bus line B-CBL1 and second branch conductive bus line B-CBL2 may include a transparent conductive material, for example, TCO.

One portion of the first branch conductive bus line B-CBL1 may be electrically connected to the second transparent conductive bus line CBL2, and another portion thereof may be electrically connected to a first electrode of a first second green light-emitting diode ED2g. One portion of the second branch conductive bus line B-CBL2 may be electrically connected to the second transparent conductive bus line CBL2, and another portion thereof may be electrically connected to a first electrode of a k'$^{th}$ second green light-emitting diode ED2g.

The length of the first branch conductive bus line B-CBL1 and the length of the second branch conductive bus line B-CBL2 may be substantially the same. For example, the length of the first branch conductive bus line B-CBL1 and the length of the second branch conductive bus line B-CBL2 being substantially the same may indicate that a deviation of the lengths is within about 10%.

Through the structures of the second transparent conductive bus line CBL2, first branch conductive bus line B-CBL1, and second branch conductive bus line B-CBL2 described above, a voltage drop of a voltage applied to k' second light-emitting diodes emitting light of a same color may be reduced, and a deviation of luminance may be reduced.

Figure 13:
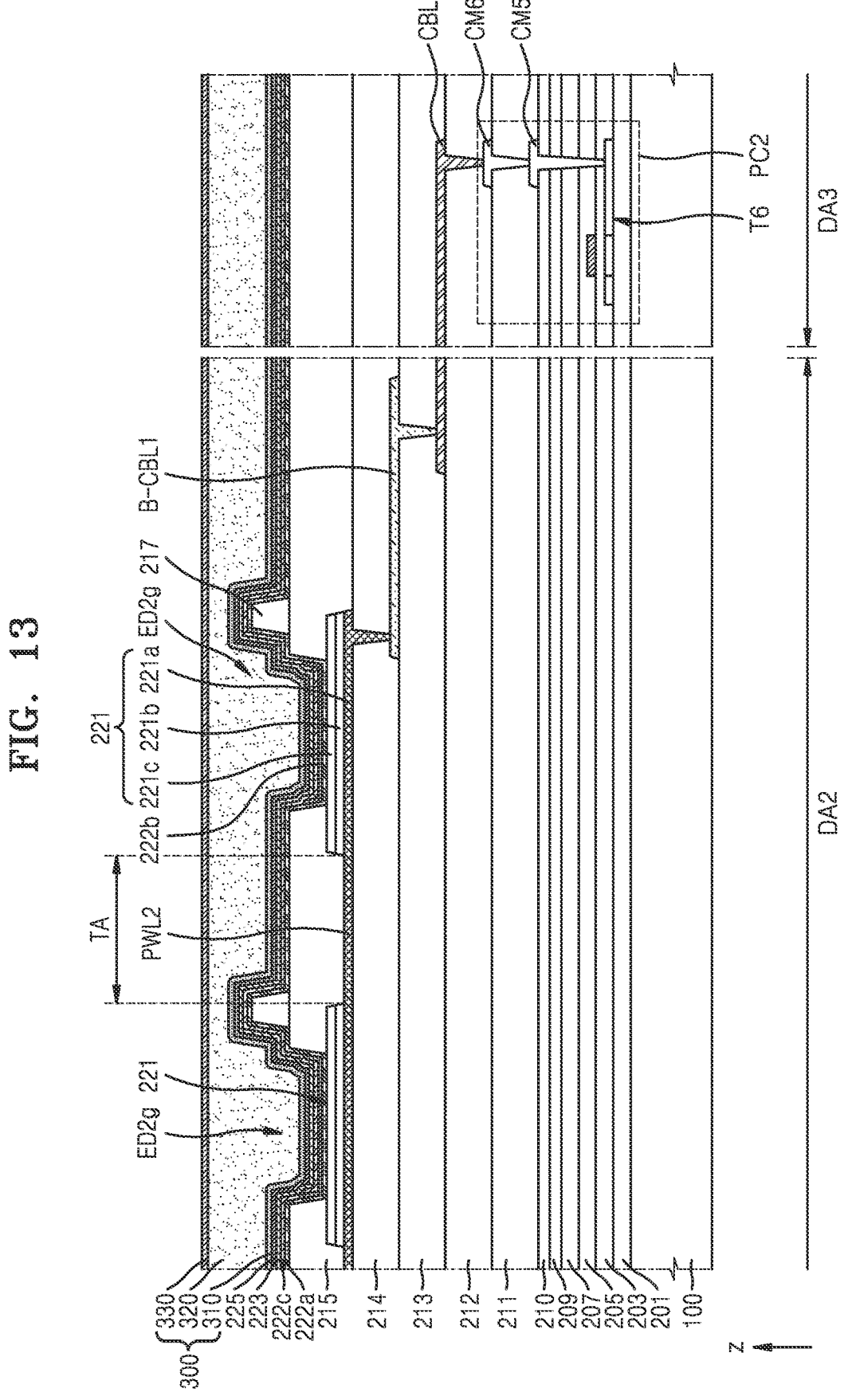
FIG. 13 is a cross-sectional view showing a second sub-pixel circuit and second light-emitting diodes of a display panel being electrically connected to each other through a transparent conductive bus line and a branch conductive bus line, according to some embodiments.

FIG. 13 is a cross-sectional view showing thee second sub-pixel circuit PC2 and second light-emitting diodes of a display panel being electrically connected to each other through a transparent conductive bus line and a branch conductive bus line, according to some embodiments. For convenience of descriptions, FIG. 13 shows the second sub-pixel circuit PC2 and the first second green light-emitting diode ED2g, which are electrically connected to each other by the second transparent conductive bus line CBL2 and first branch conductive bus lines B-CBL1 of FIG. 12.

The second transparent conductive bus line CBL2 may be electrically connected to the second sub-pixel circuit PC2. In this regard, FIG. 13 shows that the second transparent conductive bus line CBL2 is electrically connected to the sixth transistor T6 of second sub-pixel circuit PC2 through the fifth contact metal CM5 and sixth contact metal CM6.

Referring to FIGS. 12 and 13, the second transparent conductive bus line CBL2 extends from the third display area DA3 towards the second display area DA2, and may be electrically connected to the first branch conductive bus line B-CBL1 and second branch conductive bus line B-CBL2.

The second transparent conductive bus line CBL2 may be arranged on a different layer from the first branch conductive bus line B-CBL1 and second branch conductive bus line B-CBL2. According to some embodiments, as shown in FIG. 13, at least one insulating layer, for example, the third organic insulating layer 213, may be arranged between the second transparent conductive bus line CBL2 and the first branch conductive bus line B-CBL1.

The second transparent conductive bus line CBL2 and the first branch conductive bus line B-CBL1 may be electrically connected to each other through a contact hole of the third organic insulating layer 213, and the first electrode 221 of the first second green light-emitting diode ED2g may be electrically connected to the first branch conductive bus line B-CBL1 through a contact hole of the fourth organic insulating layer 214.

A structure of the second branch conductive bus line B-CBL2 of FIG. 12 may be substantially the same as a structure of the first branch conductive bus line B-CBL1. For example, an electric connection between the second branch conductive bus line B-CBL2 of FIG. 12 and a first electrode of a kth second green light-emitting diode ED2g may be substantially the same as an electric connection of FIG. 13 between the first branch conductive bus line B-CBL1 and the first electrode 221 of the first second green light-emitting diode ED2g.

The second branch conductive bus line B-CBL2 of FIG. 12 may be arranged on a same layer (for example, the third organic insulating layer 213) and include a same material as the first branch conductive bus line B-CBL1. According to some embodiments, the first branch conductive bus line B-CBL1 and the second branch conductive bus line B-CBL2 may be integrally coupled to each other.

Figure 14:
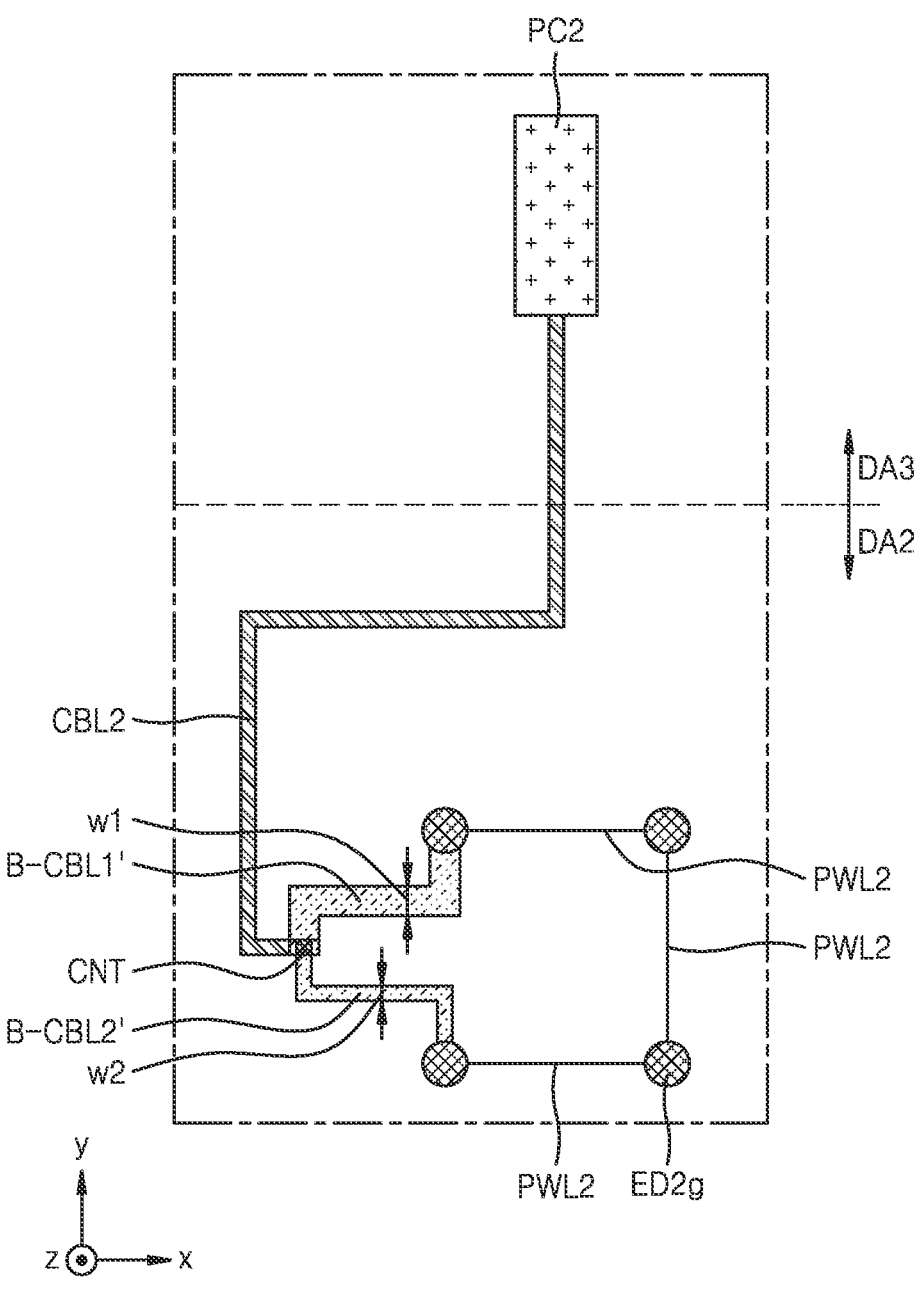
FIG. 14 is a plan view showing a second sub-pixel circuit and second light-emitting diodes of a display panel being electrically connected to each other through a transparent conductive bus line and branch conductive bus lines, according to some embodiments.

FIG. 14 is a plan view showing the second sub-pixel circuit PC2 and second light-emitting diodes of a display panel being electrically connected to each other through a transparent conductive bus line and branch conductive bus lines, according to some embodiments. According to the embodiments shown in FIG. 14, the lengths and widths of a first branch conductive bus line B-CBL1' and second branch conductive bus line B-CBL2' are different from the lengths and widths of the first branch conductive bus line B-CBL1 and second branch conductive bus line B-CBL2 according to the embodiments shown in FIG. 12. Because other configurations are substantially the same, the differences will be mainly described below.

The lengths and widths of the first branch conductive bus line B-CBL1' and second branch conductive bus line B-CBL2' may be different from each other. For example, when a deviation of the length of the first branch conductive bus line B-CBL1' and the length of the second branch conductive bus line B-CBL2' is about 10% or greater, the widths of the first branch conductive bus line B-CBL1' and second branch conductive bus line B-CBL2' may be different.

For example, when the length of the first branch conductive bus line B-CBL1' is greater than the length of the second branch conductive bus line B-CBL2', a width w1 of the first branch conductive bus line B-CBL1' may be greater than a width w2 of the second branch conductive bus line B-CBL2'. Accordingly, a voltage drop of a voltage provided from the second sub-pixel circuit PC2 through the second transparent conductive bus line CBL2, first branch conductive bus line B-CBL1', and second branch conductive bus line B-CBL2' may be reduced, and a luminance deviation between the second green light-emitting diodes ED2g may be reduced.

According to some embodiments, a display panel having relatively excellent quality and an electronic device including the same, in which transmittance of a second display area including a transmission area may be sufficiently secured and image quality may be relatively uniformly maintained without being restricted by a location of the second display area in a display area, may be provided. Such characteristics are only examples and the scope of embodiments according to the present disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display panel comprising:
a plurality of first light-emitting diodes in a first display area;

a plurality of second light-emitting diodes in a second display area inside the first display area and including a transmission area;

a plurality of third light-emitting diodes in a third display area between the first display area and the second display area;

a plurality of sub-pixel circuits in the third display area and electrically connected to the plurality of second light-emitting diodes and the plurality of third light-emitting diodes; and a transparent conductive bus line electrically connected to a sub-pixel circuit from among the plurality of sub-pixel circuits and extending from the third display area towards the second display area, wherein first electrodes of k second light-emitting diodes configured to emit light of a first color from among the plurality of second light-emitting diodes are electrically connected to each other, wherein k is an even number, and the transparent conductive bus line is connected to a connection line, wherein the connection line connects a first electrode of a $(k/2)^{th}$ second light-emitting diode of the first color and a first electrode of a $(k/2+1)^{th}$ second light-emitting diode of the first color to each other from among the k second light-emitting diodes configured to emit the light of the first color.

2. The display panel of claim 1, wherein each of the first electrodes of the k second light-emitting diodes configured to emit the light of the first color comprises a plurality of sub-layers.

3. The display panel of claim 2, wherein the connection line is integrally coupled to one sub-layer from among the plurality of sub-layers of the second light-emitting diode connected to the connection line.

4. The display panel of claim 3, wherein the connection line comprises a crystalized indium tin oxide.

5. The display panel of claim 1, further comprising:

at least one insulating layer between the transparent conductive bus line and each of first electrodes of the plurality of second light-emitting diodes, and between the transparent conductive bus line and the connection line, wherein the connection line is electrically connected to the transparent conductive bus line through a contact hole of the at least one insulating layer.

6. A display panel comprising:

a plurality of first light-emitting diodes in a first display area;

a plurality of second light-emitting diodes in a second display area inside the first display area and including a transmission area;

a plurality of third light-emitting diodes in a third display area between the first display area and the second display area;

a plurality of sub-pixel circuits in the third display area and electrically connected to the plurality of second light-emitting diodes and the plurality of third light-emitting diodes;

a transparent conductive bus line electrically connected to one sub-pixel circuit from among the plurality of sub-pixel circuits and extending from the third display area towards the second display area in a first direction; and a first branch transparent conductive bus line and a second branch transparent conductive bus line, which are electrically connected to the transparent conductive bus line, wherein first electrodes of k' second light-emitting diodes configured to emit light of a first color from among the plurality of second light-emitting diodes are electrically connected to each other, wherein k' is a natural number greater than 1, the first branch transparent conductive bus line is electrically connected to a first electrode of a first second light-emitting diode of the first color from among the k' second light-emitting diodes configured to emit the light of the first color, and the second branch transparent conductive bus line is electrically connected to a first electrode of a $k'^{th}$ second light-emitting diode of the first color from among the k' second light-emitting diodes configured to emit the light of the first color.

7. The display panel of claim 6, wherein each of the first branch transparent conductive bus line and the second branch transparent conductive bus line comprises a transparent conductive material.

8. The display panel of claim 6, wherein each of the first electrodes of the k' second light-emitting diodes configured to emit the light of the first color comprises a plurality of sub-layers.

9. The display panel of claim 8, wherein, from among the k' second light-emitting diodes configured to emit the light of the first color, a first electrode of an $i^{th}$ second light-emitting diode is electrically connected to a first electrode of an $(i+1)^{th}$ second light-emitting diode through a connection line, wherein i is a natural number smaller than k' and greater than 0, and the connection line is integrally coupled to one sub-layer from among the plurality of sub-layers of the second light-emitting diode connected to the connection line.

10. The display panel of claim 9, wherein the connection line comprises a crystalized indium tin oxide.

11. The display panel of claim 6, wherein a length of the first branch transparent conductive bus line is greater than a length of the second branch transparent conductive bus line, and a width of the first branch transparent conductive bus line is greater than a width of the second branch transparent conductive bus line.

12. The display panel of claim 6, further comprising at least one insulating layer above the first branch transparent conductive bus line and the second branch transparent conductive bus line and below the first electrodes, wherein the first branch transparent conductive bus line is electrically connected to the first electrode of the first second light-emitting diode of the first color through a first contact hole of the at least one insulating layer, and the second branch transparent conductive bus line is electrically connected to the first electrode of the $k'^{th}$ second light-emitting diode of the first color through a second contact hole of the at least one insulating layer.

13. An electronic device comprising:

a display panel comprising a first display area, a second display area inside the first display area, and a third display area between the first display area and the second display area; and a component below the display panel, wherein the display panel comprises:

a plurality of first light-emitting diodes in the first display area;

a plurality of second light-emitting diodes in the second display area including a transmission area;

a plurality of third light-emitting diodes in the third display area;

a plurality of sub-pixel circuits arranged in the third display area and electrically connected to the plurality of second light-emitting diodes and the plurality of third light-emitting diodes; and a transparent conductive bus line electrically connected to one sub-pixel circuit from among the plurality of sub-pixel circuits and extending from the third display area towards the second display area, wherein first electrodes of k second light-emitting diodes configured to emit light of a first color from among the plurality of second light-emitting diodes are electrically connected to each other, wherein k is an even number, and the transparent conductive bus line is connected to a connection line, wherein the connection line connects a first electrode of a $(k/2)^{th}$ second light-emitting diode of the first color and a first electrode of a $(k/2+1)^{th}$ second light-emitting diode of the first color to each other from among the k second light-emitting diodes configured to emit the light of the first color.

14. The electronic device of claim 13, wherein each of the first electrodes of the k second light-emitting diodes configured to emit the light of the first color comprises a plurality of sub-layers, and the connection line is integrally coupled to one sub-layer from among the plurality of sub-layers of the second light-emitting diode connected to the connection line.

15. The electronic device of claim 14, wherein the connection line comprises a crystalized indium tin oxide.

16. An electronic device comprising:

a display panel comprising a first display area, a second display area inside the first display area, and a third display area between the first display area and the second display area; and a component below the display panel, wherein the display panel comprises:

a plurality of first light-emitting diodes in the first display area;

a plurality of second light-emitting diodes in the second display area including a transmission area;

a plurality of third light-emitting diodes in the third display area;

a plurality of sub-pixel circuits in the third display area and electrically connected to the plurality of second light-emitting diodes and the plurality of third light-emitting diodes;

a transparent conductive bus line electrically connected to one sub-pixel circuit from among the plurality of sub-pixel circuits and extending from the third display area towards the second display area in a first direction; and a first branch transparent conductive bus line and a second branch transparent conductive bus line, which are connected to the transparent conductive bus line, wherein first electrodes of k' second light-emitting diodes configured to emit light of a first color from among the plurality of second light-emitting diodes are electrically connected to each other, wherein k' is a natural number greater than 1, the first branch transparent conductive bus line is electrically connected to a first electrode of a first second light-emitting diode of the first color from among the k' second light-emitting diodes configured to emit the light of the first color, and the second branch transparent conductive bus line is electrically connected to a first electrode of a $k'^{th}$ second light-emitting diode of the first color from among the k' second light-emitting diodes configured to emit the light of the first color.

17. The electronic device of claim 16, wherein each of the first branch transparent conductive bus line and the second branch transparent conductive bus line comprises a transparent conductive material.

18. The electronic device of claim 16, wherein, from among the k' second light-emitting diodes configured to emit the light of the first color, a first electrode of an $i^{th}$ second light-emitting diode is electrically connected to a first electrode of an $(i+1)^{th}$ second light-emitting diode through a connection line, wherein i is a natural number smaller than k' and greater than 0, each of the first electrodes of the k' second light-emitting diodes configured to emit the light of the first color comprises a plurality of sub-layers, and the connection line is integrally coupled to one sub-layer from among the plurality of sub-layers of the second light-emitting diode connected to the connection line.

19. The electronic device of claim 16, wherein a length of the first branch transparent conductive bus line is greater than a length of the second branch transparent conductive bus line, and a width of the first branch transparent conductive bus line is greater than a width of the second branch transparent conductive bus line.

20. The electronic device of claim 16, wherein the component comprises a sensor or a camera.

* * * * *